(12) United States Patent
Sim et al.

(10) Patent No.: US 11,787,964 B2
(45) Date of Patent: Oct. 17, 2023

(54) LIGHT EMITTING ELEMENT INK AND METHOD OF MANUFACTURING DISPLAY DEVICE

(71) Applicant: Samsung Display Co., Ltd., Yongin-si (KR)

(72) Inventors: Jun Bo Sim, Suwon-si (KR); Hyo Jin Ko, Seoul (KR); Duk Ki Kim, Suwon-si (KR); Chang Hee Lee, Seoul (KR); Jae Kook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 17/233,288

(22) Filed: Apr. 16, 2021

(65) Prior Publication Data

US 2021/0332256 A1    Oct. 28, 2021

(30) Foreign Application Priority Data

Apr. 22, 2020   (KR) .................. 10-2020-0048795

(51) Int. Cl.
*C09D 11/38* (2014.01)
*C09D 11/50* (2014.01)
(Continued)

(52) U.S. Cl.
CPC .............. *C09D 11/38* (2013.01); *C09D 11/50* (2013.01); *H10K 50/844* (2023.02); *H10K 71/00* (2023.02); *C09K 11/06* (2013.01); *C09K 2211/10* (2013.01)

(58) Field of Classification Search
CPC ......... C09D 11/38; C09D 11/50; C09D 11/52; H10K 50/844; H10K 71/00; H10K 50/11;
(Continued)

(56) References Cited

U.S. PATENT DOCUMENTS 9,112,112 B2    8/2015   Do et al.
9,528,013 B2    12/2016  Takabayashi et al.
(Continued)

FOREIGN PATENT DOCUMENTS

CN    103594460 A    2/2014
CN    103608937 A    2/2014
(Continued)

OTHER PUBLICATIONS

Extended European Search Report for corresponding European Patent Application No. 21169292.6-1102, dated Sep. 13, 2021 (8 pages).

(Continued)

*Primary Examiner* — Caleb E Henry
(74) *Attorney, Agent, or Firm* — Lewis Roca Rothgerber Christie LLP

(57) ABSTRACT

A light emitting element ink and a method of manufacturing a display device are provided. The light emitting element ink includes a light emitting element solvent, a light emitting element dispersed in the light emitting element solvent, the light emitting element including a plurality of semiconductor layers and an insulating film surrounding outer surfaces of the semiconductor layers, a thickener dispersed in the light emitting element solvent, wherein a compound of the thickener includes a functional group capable of forming a hydrogen bond together with a compound of the light emitting element solvent or another compound of the thickener and the compound of the thickener is represented by Chemical Formula 1.

8 Claims, 18 Drawing Sheets

(51) Int. Cl.
*H10K 50/844* (2023.01)
*H10K 71/00* (2023.01)
*C09K 11/06* (2006.01)

(58) Field of Classification Search
CPC .... H10K 50/182; H10K 59/122; H10K 71/12; H10K 71/135; H10K 71/15; C09K 11/06; C09K 2211/10; C09K 11/02; H01L 24/95; H01L 33/44; H01L 33/62; H01L 2224/95085; H01L 25/0753; H01L 33/0095; H01L 33/20; H01L 33/26; H01L 51/56; H01L 51/5287; H01L 51/5012; H01L 51/0003; H01L 27/3246; H01L 51/0005; H01L 51/0007; H01L 51/5253

See application file for complete search history.

(56) References Cited

U.S. PATENT DOCUMENTS

| | | | | |
|---|---|---|---|---|
| 10,573,813 | B2* | 2/2020 | Jia | H10K 71/00 |
| 11,214,699 | B2* | 1/2022 | Choi | H10K 71/15 |
| 11,597,848 | B2* | 3/2023 | Sim | C09D 11/50 |
| 2001/0003602 | A1* | 6/2001 | Fujita | H10K 71/15 |
| | | | | 427/64 |
| 2007/0001608 | A1* | 1/2007 | Lee | H01J 29/864 |
| | | | | 313/587 |
| 2009/0152509 | A1* | 6/2009 | Choi | C09D 11/52 |
| | | | | 252/511 |
| 2009/0246484 | A1 | 10/2009 | Kumagai et al. | |
| 2012/0021547 | A1* | 1/2012 | Kawanishi | H10K 71/135 |
| | | | | 257/E51.024 |
| 2016/0126499 | A1* | 5/2016 | Dai | H10K 50/15 |
| | | | | 257/40 |
| 2020/0308435 | A1* | 10/2020 | Kim | C09D 11/36 |
| 2021/0036253 | A1* | 2/2021 | Asaoka | H05B 33/14 |
| 2021/0179876 | A1* | 6/2021 | Li | H10K 85/636 |
| 2021/0202800 | A1 | 7/2021 | Jung et al. | |
| 2021/0269662 | A1* | 9/2021 | Sim | H10K 71/135 |
| 2021/0273131 | A1 | 9/2021 | Kang et al. | |
| 2021/0332256 | A1* | 10/2021 | Sim | H10K 50/11 |

FOREIGN PATENT DOCUMENTS

| | | |
|---|---|---|
| CN | 107141887 A | 9/2017 |
| CN | 109301051 A | 2/2019 |
| CN | 110895381 A | 3/2020 |
| KR | 10-0740482 B1 | 7/2007 |
| KR | 10-2018-0007376 A | 1/2018 |
| WO | WO 2020/040368 A1 | 2/2020 |
| WO | WO 2020/060006 A1 | 3/2020 |
| WO | WO 2020/091174 A1 | 5/2020 |
| WO | WO 2020/189924 A1 | 9/2020 |

OTHER PUBLICATIONS

Office action dated Jul. 5, 2023 issued in corresponding CN 202110428714.2, 12 pp.
"Application of Digital Inkjet Printing Technology and Equipment in the Area of Ceramic Tiles"; edited by Huining Huang; China Construction Materials Industry Press; First version; May 2018, pp. 151-152.
"Organic Chemical Industry of Agricultural Products"; edited by Gengyuan Shan; Shandog science and technology press; 1979; JInan; pp. 404-411.

* cited by examiner

LIGHT EMITTING ELEMENT INK AND METHOD OF MANUFACTURING DISPLAY DEVICE

CROSS-REFERENCE TO RELATED APPLICATION

This application claims priority to and the benefit of Korean Patent Application No. 10-2020-0048795 filed on Apr. 22, 2020 in the Korean Intellectual Property Office, the entire contents of which are hereby incorporated by reference.

BACKGROUND

1. Field Disclosure

The present disclosure relates to a light emitting element ink and a method of manufacturing a display device. For example, the present disclosure relates to a light emitting element ink capable of adjusting a viscosity according to conditions by including a thickener and a method of manufacturing a display device using the light emitting element ink.

2. Description of the Related Art

The importance of display devices has increased with the development of multimedia. Accordingly, various types (or kinds) of display devices such as, for example, an organic light emitting display (OLED) and a liquid crystal display (LCD) have been used.

A display device for displaying an image includes a display panel such as an organic light emitting display panel or a liquid crystal display panel. Among display panels, an organic light emitting display panel includes an organic light emitting element, such as a light emitting diode (LED). The light emitting diode (LED) may include an organic light emitting diode (OLED) using an organic material as a fluorescent material and an inorganic light emitting diode using an inorganic material as a fluorescent material.

SUMMARY

An aspect of an embodiment of the present disclosure is to provide a light emitting element ink in which light emitting elements are not precipitated during storage by including a thickener.

Another aspect of an embodiment of the present disclosure is to provide a method of manufacturing a display device using the light emitting element ink, in which foreign matter is completely (or substantially completely) removed after a printing process to improve product reliability.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of embodiments of the present disclosure given below.

According to an exemplary embodiment of the present disclosure, a light emitting element ink includes a light emitting element solvent, a light emitting element dispersed in the light emitting element solvent, each light emitting element including a plurality of semiconductor layers and an insulating film surrounding outer surfaces of the semiconductor layers, a thickener dispersed in the light emitting element solvent, wherein a compound of the thickener includes a functional group capable of forming a hydrogen bond together with a compound of the light emitting element solvent or another compound of the thickener, and the compound of the thickener is represented by Chemical Formula 1 below:

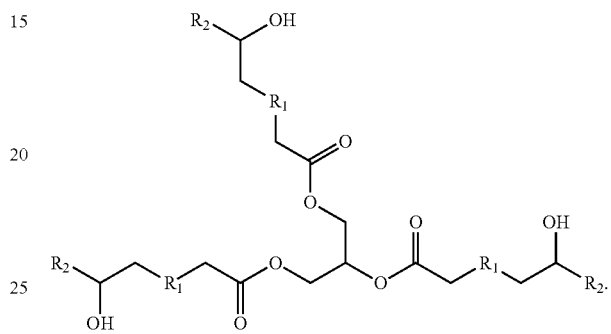

Chemical Formula 1 wherein, in Chemical Formula 1, each $R_1$ may be independently a substituted or unsubstituted alkyl group having 6 to 8 carbon atoms, an alkene group, an alkenyl group, or an alkynyl group, and each $R_2$ may be independently an alkyl group having 3 to 8 carbon atoms.

The compound of the thickener may be represented by any one selected from Chemical Formulas 2 to 6:

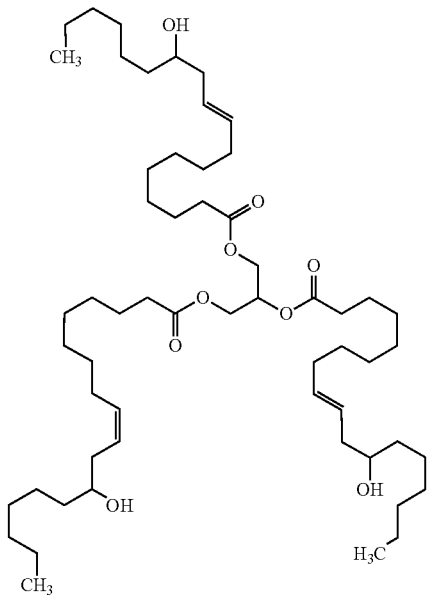

Chemical Formula 2

Chemical Formula 3

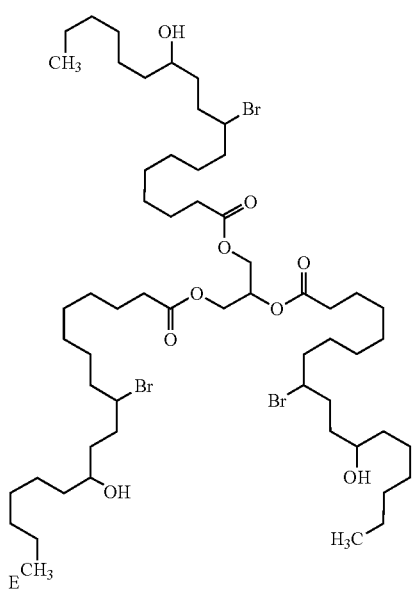

Chemical Formula 4

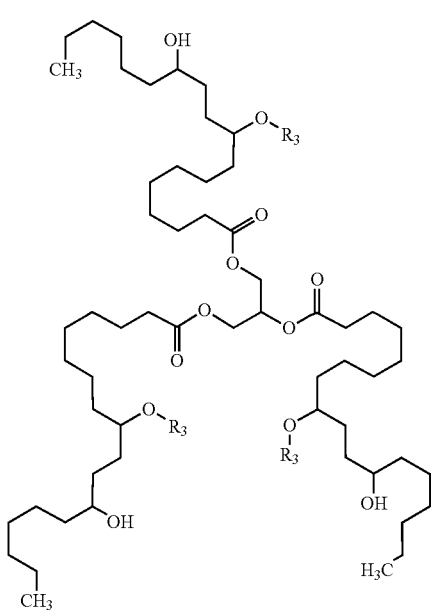

Chemical Formula 5

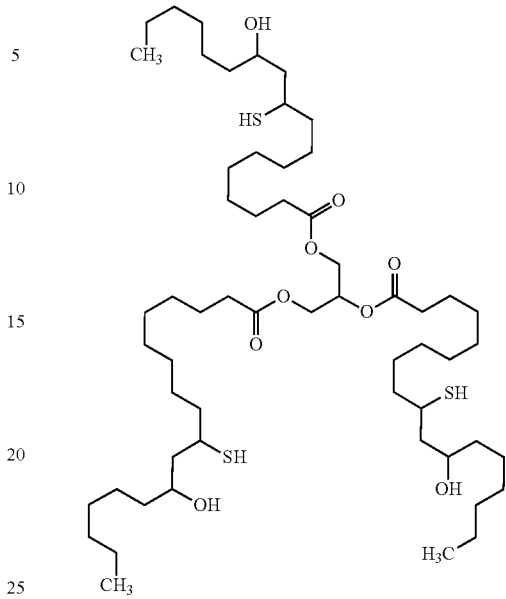

Chemical Formula 6

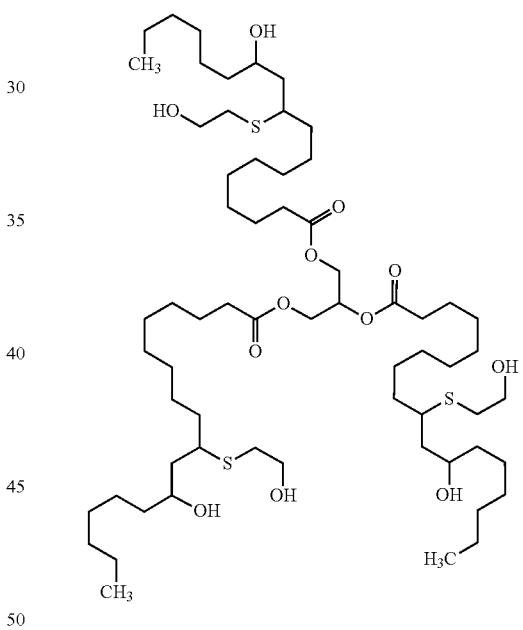

wherein, in Chemical Formula 4, $R_3$ is *—$(CH_2CH_2O)xCH_3$, x is an integer of 7 to 112, and —* is a bond with an oxygen atom (O)).

In a state in which shear stress is not applied to the light emitting element ink, the compound of the thickener may form an intermolecular hydrogen bond together with the compound of the light emitting element solvent and the other compound of the thickener to form a network structure.

The light emitting element ink may have a viscosity in a range of from 30 cP to 300 cP, measured at 25° C. in a state in which shear stress is not applied to the light emitting element ink.

In a state in which shear stress is applied to the light emitting element ink, the compound of the thickener may not form an intermolecular hydrogen bond together with the compound of the light emitting element solvent and the other compound of the thickener, and the light emitting element ink may have a viscosity in a range of from 5 cP to 15 cP, measured at 25° C.

The light emitting element may be included in the light emitting element ink in an amount of 0.01 to 1 part by weight with respect to 100 parts by weight of the light emitting element ink, and the thickener may be included in the light emitting element ink in an amount of 100 to 500 parts by weight with respect to 100 parts by weight of the light emitting element.

The light emitting element ink may further include a dispersant dispersed in the light emitting element solvent, wherein the dispersant may be included in the light emitting element ink in an amount of 10 to 50 parts by weight with respect to 100 parts by weight of the light emitting element.

The semiconductor layers of the light emitting element may include a first semiconductor layer, a second semiconductor layer, and a light emitting layer between the first semiconductor layer and the second semiconductor layer, and the insulating film of the light emitting element may surround at least an outer surface of the light emitting layer.

According to an exemplary embodiment of the present disclosure, a method of manufacturing a display device includes preparing a light emitting element ink including a light emitting element solvent, a plurality of light emitting elements, and a thickener and preparing a target substrate including a first electrode and a second electrode on the target substrate, ejecting the light emitting element ink onto the target substrate, forming an electric field on the target substrate to place the light emitting elements on the first electrode and the second electrode and treating the light emitting element ink under a low-pressure environment to remove the light element solvent and the thickener.

A compound of the thickener of the light emitting element ink may include a functional group capable of forming a hydrogen bond together with a compound of the light emitting element solvent or another compound of the thickener, and includes a compound represented by Chemical Formula 1 above.

The compound of the thickener may be represented by any one selected from Chemical Formulas 2 to 6 above.

The light emitting elements may be included in the light emitting element ink in an amount of 0.01 to 1 part by weight with respect to 100 parts by weight of the light emitting element ink, and the thickener may be included in the light emitting element ink in an amount of 100 to 500 parts by weight with respect to 100 parts by weight of the light emitting element.

In the preparing of the light emitting element ink, the compound of the thickener may form an intermolecular hydrogen bond together with the compound of the light emitting element solvent and the other compound of the thickener to form a network structure.

In the preparing of the light emitting element ink, the light emitting element ink may have a viscosity in a range of from 30 cP to 300 cP, measured at 25° C.

In the ejecting of the light emitting element ink, the light emitting elements in the light emitting element ink may be redispersed.

The ejecting of the light emitting element ink may be performed by a printing process using an inkjet printing apparatus, a shear stress may be applied to the light emitting element ink, and the light emitting element ink may be ejected onto the target substrate through a nozzle.

In the ejecting of the light emitting element ink, the light emitting element ink may have a viscosity in a range of from 5 cP to 15 cP, measured at 25° C.

The removing of the light emitting element solvent and the thickener may be performed at a pressure of $10^{-4}$ Torr to 1 Torr and a temperature of 25° C. to 150° C.

In the placing of the light emitting elements, a first end of the light emitting element may be on the first electrode, and a second end thereof may be on the second electrode.

Each of the light emitting elements may include a first semiconductor layer, a second semiconductor layer, an active layer between the first semiconductor layer and the second semiconductor layer, and an insulating film that surrounds at least an outer surface of the active layer.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

The subject matter of the present disclosure will now be described more fully hereinafter with reference to the accompanying drawings, in which certain embodiments of the disclosure are shown. The subject matter of this disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments of the present disclosure will be described with reference to the attached drawings.

Figure 1:
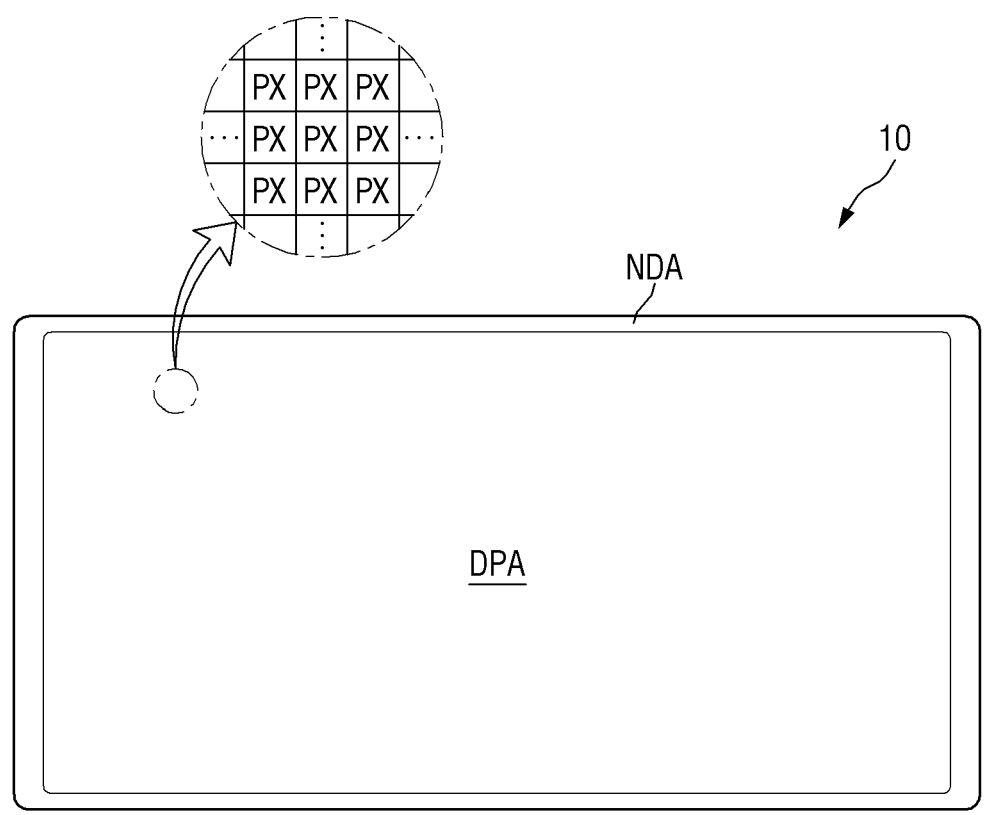
FIG. 1 is a schematic plan view of a display device according to an embodiment.

FIG. 1 is a schematic plan view of a display device according to an embodiment.

Referring to FIG. 1, a display device 10 displays a mobile image or a still image. The display device 1 may refer to any suitable electronic device that provides a display screen. For example, the display device 1 may be used in televisions, notebooks, monitors, billboards, internet of things devices, mobile phones, smart phones, tablet personal computers (PCs), electronic watches, smart watches, watch phones, head mounted displays, mobile communication terminals, electronic notebooks, electronic books, portable multimedia players (PMPs), navigators (e.g., navigation systems), game machines, digital cameras, camcorder, and/or the like.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, there will be exemplified a case where an inorganic light emitting diode display panel is used as the display panel, but the present disclosure is not limited thereto. Any suitable display panel may be used as the display panel as long as substantially the same technical idea of the present disclosure is applicable.

The shape of the display device 10 may be variously modified. For example, the display device 10 may have a shape such as a rectangle having longer horizontal sides (e.g., longer than the vertical sides), a rectangle having longer vertical sides (e.g., longer than the horizontal sides), a square, a rectangle having round corners (vertexes), another polygon, or a circle. The shape of a display area DPA of the display device 1 may also be similar to the overall shape of the display device 10. FIG. 1 illustrates a display device 10 and a display area DPA each having a rectangular shape having longer horizontal sides.

The display device 1 may include a display area DPA and a non-display area NDA. The display area DPA is an area where an image is displayed, and the non-display area NDA is an area where an image is not displayed (or an area that is not designed to display an image). The display area DPA may be referred to as an active area, and the non-display area NDA may be referred to as an inactive area. The display area DPA may generally occupy a center of the display device 1.

The display area DPA may include a plurality of pixels PX. The plurality of pixels PX may be arranged in a matrix direction. Each of the pixels PX may have a rectangular shape or a square shape in a plan view, but the shape thereof is not limited thereto. Each of the pixels PX may have a rhombus shape in which each side is inclined with respect to one direction. The respective pixels PX may be alternately arranged in a stripe type or a pentile type (e.g., a stripe pattern or pentile pattern). Each of the pixels PX includes at least one light emitting element 300 emitting light having a set or specific wavelength band to display a set or specific color.

The non-display area NDA may be located around the display area DPA. The non-display area NDA may entirely or partially surround the display area DPA. The display area DPA may have a rectangular shape, and the non-display area NDA may be adjacent to four sides of the display area DPA. The non-display area NDA may constitute a bezel of the display device 10. Wirings or circuit drivers included in the display device 10 may be in the non-display area NDA, and/or external devices may be mounted in the non-display area NDA.

Figure 2:
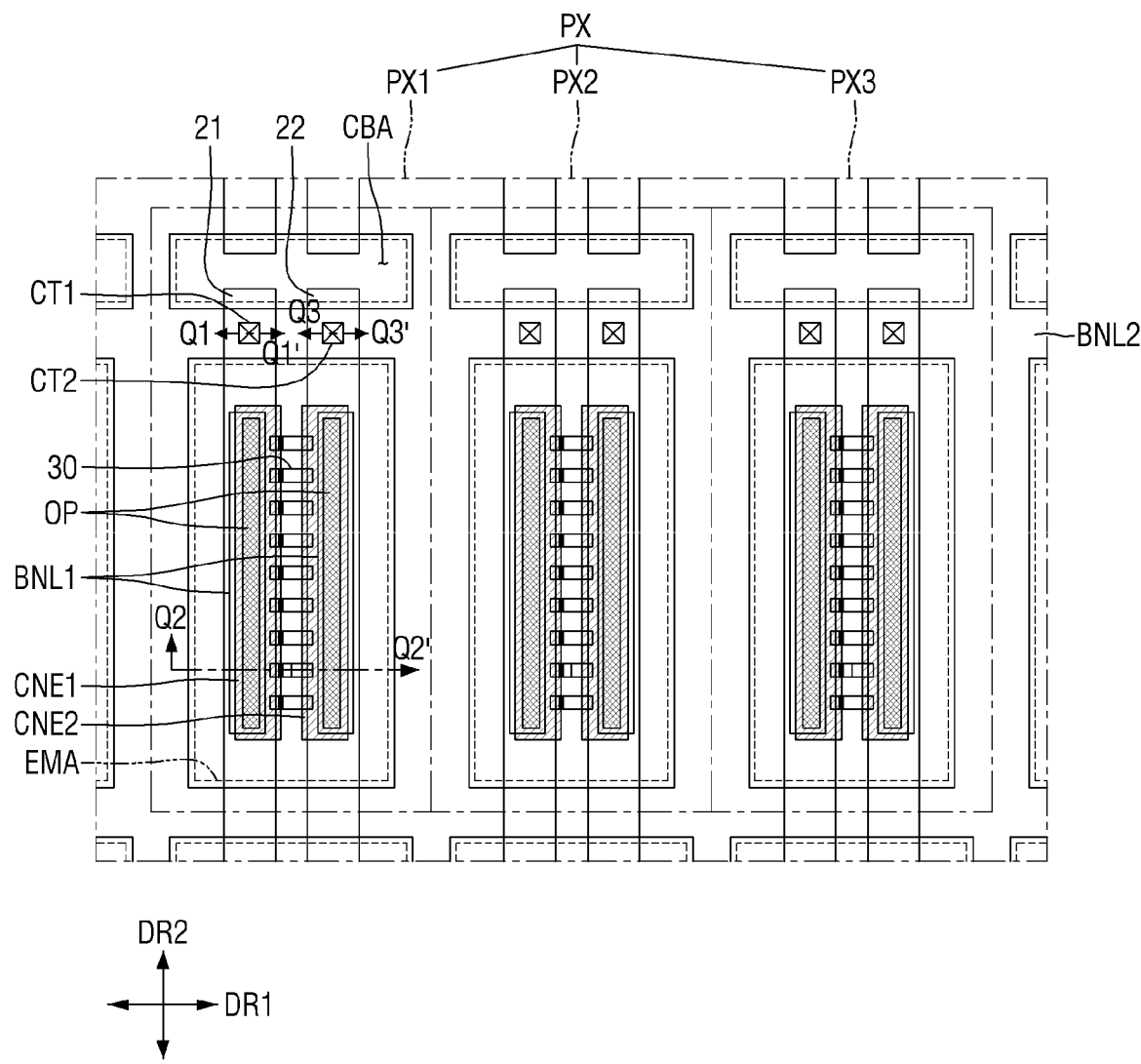
FIG. 2 is a plan view illustrating one pixel of a display device according to an embodiment.

FIG. 2 is a plan view illustrating one pixel of a display device according to an embodiment.

Referring to FIG. 2, each of the pixels PX may include a plurality of sub-pixels PXn (n is an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the present disclosure is not limited thereto, and each of the sub-pixels PXn ma emit light of the same (e.g., substantially the same) color. Although it is shown in FIG. 2 that the pixel PX includes three sub-pixels PXn, and two pixels PX include six sub-pixels PXn, the present disclosure is not limited thereto, and the pixel PX may include a larger or smaller number of sub-pixels PXn.

Each of the sub-pixels PXn of the display device 10 may include a light emitting area EMA and a non-light emitting area. The light emitting area EMA is defined as an area in which a light emitting element 300 is located to emit light having a set or specific wavelength band, and the non-light emitting area is defined as an area in which no light emitting element 300 is located and no light is emitted (or is not designed to emit light). The light emitting area EMA may include an area in which the light emitting element 30 is located, and an area adjacent to the light emitting element 30 to discharge light emitted from the light emitting element 30.

However, the present disclosure is not limited thereto, and the light emitting area may also include an area in which light emitted from the light emitting element 30 is reflected or refracted by another member and then emitted. The plurality of light emitting elements 30 may be arranged in each of the sub-pixels PXn, and the light emitting area may be formed by an area in which the plurality of light emitting elements 30 are arranged and an area adjacent to this area.

Each of the sub-pixels PXn may include a cut area CBA in the non-light emitting area. The cut area CBA may be at one side of the light emitting area EMA in the second direction DR2. The cut area CBA may be between the light emitting areas EMA of the neighboring sub-pixels PXn in the second direction DR2. A plurality of light emitting areas EMA and a plurality of cut areas CBA may be arranged in the display area DPA of the display device 10. For example, the plurality of light emitting areas EMA and the plurality of cut area CBA may be repeatedly arranged in the first direction DR1, respectively, and may be alternately arranged in the second direction DR2. The distance between the cut areas CBA spaced apart from each other in the first direction DR1 may be smaller than the distance between the light emitting areas EMA spaced apart from each other in the first direction DR1. A second bank BNL2 is between the cut areas CBA and the light emitting areas EMA, and the distance therebetween may be changed or varied depending on the width of the second bank BNL2. Because the light emitting element 30 is not in the cut area CBA, light is not emitted, but a part of electrodes 21 and 22 in each of the sub-pixels PXn may be located. The electrodes 21 and 22 located ed for each of the sub-pixels PXn may be separately from each other in the cut area CBA.

Figure 3:
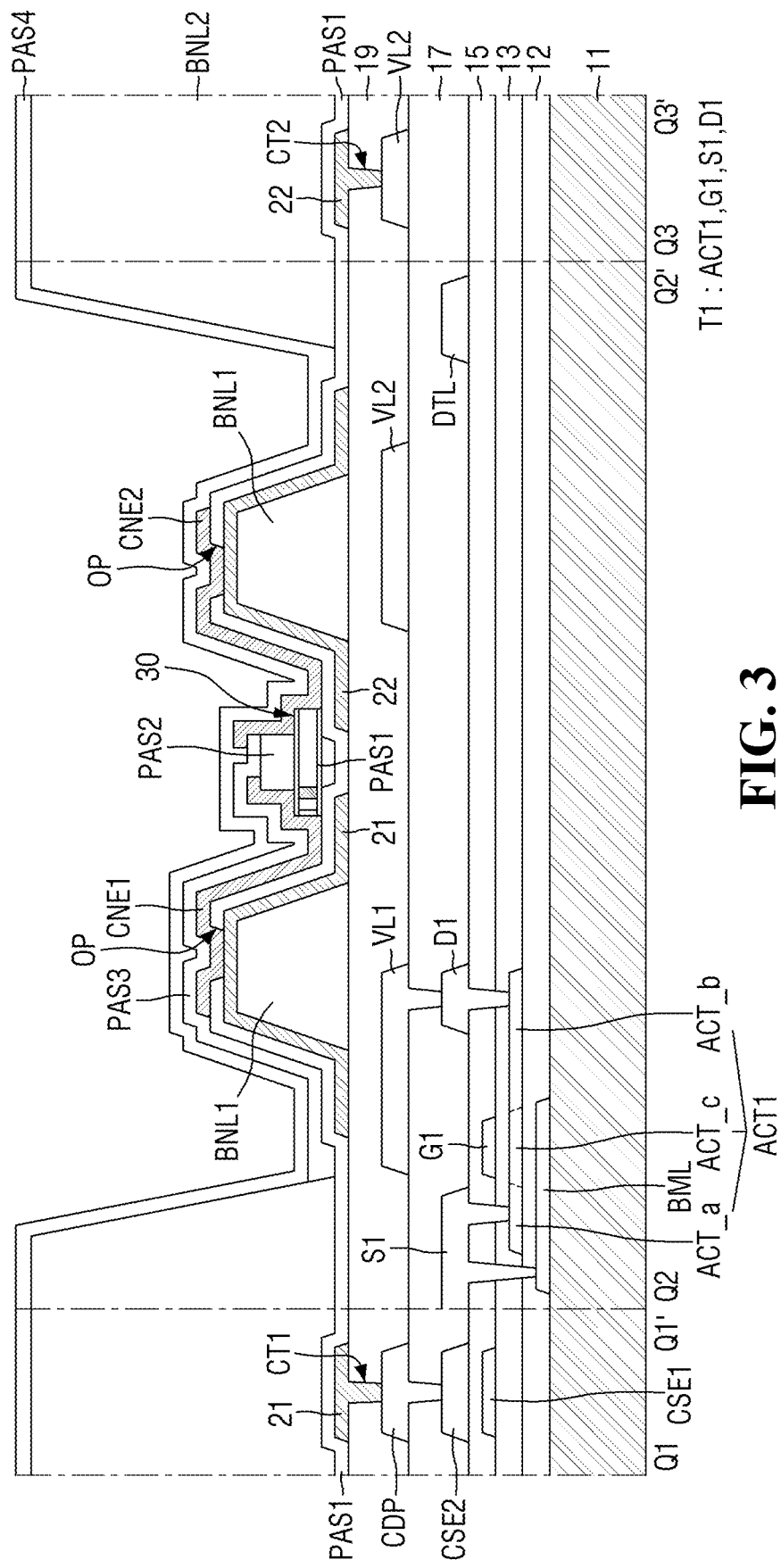
FIG. 3 is a cross-sectional view taken along the lines Q1-Q1', Q2-Q2', and Q3-Q3' of FIG. 2.

FIG. 3 is a cross-sectional view taken along the lines Q1-Q1', Q2-Q2', and Q3-Q3' of FIG. 2. FIG. 3 illustrates a cross section across both ends of the light emitting element 30 in the first sub-pixel PX1 of FIG. 2.

Referring to FIG. 3 together with FIG. 2, the display device 10 may include a first substrate 11, and a semiconductor layer, a plurality of conductive layers, and a plurality of insulating layers, which are on the first substrate 11. The semiconductor layer, the conductive layers, and the insulating layers may constitute (or form) a circuit layer and a light emitting element layer of the display device 10, respectively.

In some embodiments, the first substrate 11 may be an insulating substrate. The first substrate 11 may be made of an insulating material such as glass, quartz, and/or polymer resin. The first substrate 11 may be a rigid substrate, or may be a flexible substrate capable of bending, folding, rolling, and/or the like.

A light blocking layer BML may be on the first substrate 11. The light blocking layer BML is located to overlap an active layer ACT1 of a first transistor T1 of the display device 10. The light blocking layer BML1 may include a material blocking light, thereby preventing or reducing entrance of light into the active layer ACT1 of the first transistor. For example, the light blocking layer BML may be formed of an opaque (or substantially opaque) metal material that blocks (or reduces) light transmission. However, the present disclosure is not limited thereto, and in some cases, the light blocking layer BML may be omitted.

A buffer layer 12 may be entirely on the first substrate 11 and the light blocking layer BML. The buffer layer 12 may be formed on the first substrate 11 to protect the first transistors T1 of the pixel PX from moisture penetrating through the first substrate 11 which is vulnerable to moisture permeation, and may perform a surface planarization function. The buffer layer 12 may be formed as a plurality of inorganic layers alternately stacked. For example, the buffer layer 12 may be formed to have a multi-layer structure in which inorganic layers including at least one selected from silicon oxide (SiOx), silicon nitride (SiNx), and silicon oxynitride (SiON) are alternately stacked.

A semiconductor layer is on the buffer layer 12. The semiconductor layer may include the active layer ACT1 of the first transistor T1. The semiconductor layer and the buffer layer 12 may partially overlap a gate electrode G1 and/or the like of a first gate conductive layer to be further described herein below.

In the drawings, only the first transistor T1 among the transistors included in the sub-pixel PXn of the display device 10 is illustrated, but the present disclosure is not limited thereto. For example, the display device 10 may include a larger number of transistors. In some embodiments, the display device 10 may include two or three transistors, including one or more transistors in addition to the first transistor T1, for each sub-pixel PXn.

The semiconductor layer may include polycrystalline silicon, monocrystalline silicon, and/or oxide semiconductor. When the semiconductor layer includes an oxide semiconductor, each active layer ACT1 may include a plurality of conducting regions (e.g., electrically conductive regions) ACT_a and ACT_b and a channel region ACT_c therebetween. The oxide semiconductor may be an oxide semiconductor containing indium (In). For example, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), and/or indium-gallium-zinc-tin oxide (IGZTO).

In another embodiment, the semiconductor layer may include polycrystalline silicon. Polycrystalline silicon may be formed by crystallizing amorphous silicon, and in this case, the conducting regions (e.g., the electrically conductive regions) of the active layer ACT1 may be doped regions doped with impurities, respectively.

A first gate insulating layer 13 is on the semiconductor layer and the buffer layer 12. The first gate insulating layer 13 may be on the buffer layer 12 in addition to the semiconductor layer. The first gate insulating layer 13 may function as a gate insulating film of each transistor. The first gate insulating layer 13 may be formed of an inorganic layer including an inorganic material, such as silicon oxide (SiOx), silicon nitride (SiNx), and/or silicon oxynitride (SiON), or may be formed as a stacked structure of the inorganic layers.

A first gate conductive layer is on the first gate insulating layer 13. The first gate conductive layer may include a gate electrode G1 of the first transistor T1 and a first capacitive electrode CSE1 of the storage capacitor. The gate electrode G1 may overlap the channel region ACTc of the active layer ACT1 in the thickness direction. The first capacitive electrode CSE1 may overlap a second capacitive electrode CSE2, which will be further described herein below, in the thickness direction. In an embodiment, the first capacitive electrode CSE1 may be integrated with the gate electrode G1. The first capacitor electrode CSE1 may overlap the second capacitor electrode CSE2 in the thickness direction, and the storage capacitor may be formed therebetween.

The first gate conductive layer may be formed as a single layer or a plurality of layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A first interlayer insulating layer 15 is on the first gate conductive layer. The first interlayer insulating layer 15 may function as an insulating film between the first gate conductive layer and other layers thereon. The first interlayer insulating layer 15 may cover the first gate conductive layer to perform a function of protecting the first gate conductive layer. The first interlayer insulating layer 15 may be formed of an inorganic layer including an inorganic material, such as silicon oxide (SiOx), silicon nitride (SiNx), and/or silicon oxynitride (SiON), or may be formed as a stacked structure of the inorganic layers.

A first data conductive layer is on the first interlayer insulating layer 15. The first data conductive layer may include a first source electrode S1 and a first drain electrode D1 of the first transistor T1, a data line DTL, and a second capacitive electrode CSE2.

The first source electrode S1 and first drain electrode D1 of the first transistor T1 may contact (e.g., physically contact) the doped regions ACT_a and ACT_b of the active layer ACT1 through a contact hole penetrating the first interlayer insulating layer 15 and the first gate insulating layer 13, respectively. Further, the first source electrode S1 of the first transistor T1 may be electrically coupled to the light blocking layer BML through another contact hole.

The data line DTL may apply a data signal to another transistor included in the display device 10. The data line DTL may be coupled to a source/drain electrode of another transistor to transfer a signal applied from the data line DTL.

The second capacitive electrode CSE2 may overlap the first capacitive electrode CSE1 in the thickness direction. In an embodiment, the second capacitive electrode CSE2 may be integrally coupled to the first source electrode S1.

The first data conductive layer may be formed as a single layer or a plurality of layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A second interlayer insulating layer 17 is on the first data conductive layer. The second interlayer insulating layer 17 may function as an insulating film between the first data conductive layer and other layers thereon. The second interlayer insulating layer 17 may cover the first data conductive layer to perform a function of protecting the first data conductive layer. The second interlayer insulating layer 17 may be formed of an inorganic layer including an inorganic material, such as silicon oxide (SiOx), silicon nitride (SiNx), and/or silicon oxynitride (SiON), or may be formed as a stacked structure of the inorganic layers.

A second data conductive layer is on the second interlayer insulating layer 17. The second data conductive layer may include a first voltage line VL1, a second voltage line VL2, and a first conductive pattern CDP. A high-potential voltage (or a first power voltage) supplied to the first transistor T1 may be applied to first voltage line VL1, and a low-potential voltage (or a second power voltage) supplied to the second electrode 22 may be applied to the second voltage line VL2. During the process of manufacturing the display device 10, an alignment signal used to align the light emitting elements 30 may be applied to the second voltage line VL2.

The first conductive pattern CDP may be coupled to the second capacitive electrode CSE2 through a contact hole formed in the second interlayer insulating layer 17. The second capacitive electrode CSE2 may be integrated with the first source electrode S1 of the first transistor T1, and the first conductive pattern CDP may be electrically coupled to the first source electrode S1. The first conductive pattern CDP may also be in contact (e.g., physically contact) with the first electrode 21, which will be further described herein below, and the first transistor T1 may transfer a first power voltage applied from the first voltage line VL1 to the first electrode 21 through the first conductive pattern CDP. Although it is shown in the drawings that the second data conductive layer includes one second voltage line VL2 and one first voltage line VL1, the present disclosure is not limited thereto. The second data conductive layer may include a larger number of first voltage lines VL1 and a larger number of second voltage lines VL2.

The second data conductive layer may be formed as a single layer or a plurality of layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A first planarization layer 19 is on the second data conductive layer. The first planarization layer 19 may include an organic insulating material, for example, an organic material such as polyimide (PI), to perform a surface planarization function.

A plurality of first banks BNL1, a plurality of electrodes 21, 22, a light emitting element 30, a plurality of contact electrodes CNE1 and CNE2, and a second bank BNL2 are on the first planarization layer 19. Further, a plurality of insulating layers PAS1, PAS2, PAS3, and PAS4 may be on the first planarization layer 19.

The plurality of first banks BNL1 may be directly on the first planarization layer 19. The plurality of first banks BNL1 have a shape extending in the second direction DR2 within each sub-pixel PXn, but do not extend to another neighboring sub-pixel PXn in the second direction DR2 and may be in the light emitting area EMA. The plurality of first banks BNL1 may be spaced apart from each other in the first direction DR1, and the light emitting element 30 may be between the plurality of first banks BNL1. The plurality of first banks BNL1 may be provided for each sub-pixel PXn to form a linear pattern in the display area DPA of the display device 10. In the drawings, two first banks BNL1 are shown, but the present disclosure is not limited thereto. A larger number of first banks BNL1 may be arranged depending on the number of electrodes 21 and 22.

The first bank BNL1 may have a structure in which at least a part thereof protrudes from the upper surface of the first planarization layer 19. The protruding portion of the first bank BNL1 may have an inclined side surface (e.g., inclined relative to the upper surface of the first planarization layer 19), and the light emitted from the light emitting element 30 may be reflected from the electrodes 21 and 22 on the first bank BNL1 and emitted in the upward direction of the planarization layer 19. The first bank BNL1 may provide an area in which the light emitting element 30 is located, and at the same time, may function as a reflective barrier that reflects light emitted from the light emitting element 30 in an upward direction. The side surface of the first bank BNL1 may be inclined in a linear shape, but is not limited thereto, and the first bank BNL1 may have a curved semi-circle or semi-ellipse shape. The first banks BNL1 may include an organic insulating material such as polyimide (PI), but the material thereof is not limited thereto.

A plurality of electrodes 21 and 22 are on the first bank BNL1 and the first planarization layer 19. The plurality of electrodes 21 and 22 may include a first electrode 21 and a second electrode 22. The first electrode 21 and the second electrode 22 may extend in the second direction DR2, and may be spaced apart from each other in the first direction DR1.

Each of the first electrode 21 and the second electrode 22 may extend in the second direction DR2 within the sub-pixel PXn, and may be separated from other electrodes 21 and 22 in the cut area CBA. For example, the cut area CBA may be between the light emitting areas EMA of the sub-pixels PXn neighboring in the second direction DR2, and the first electrode 21 and the second electrode 22 may be separated from other first and second electrodes 21 and 22 in the sub-pixels PXn neighboring in the second direction DR2 in the cut area CBA. However, the present disclosure is not limited thereto, and some of the electrodes 21 and 22 may extend beyond the sub-pixels PXn neighboring in the second direction DR2 without being separated from each other for each pixel PXn, or only one of the first electrode 21 and the second electrode 22 may be separated.

The first electrode 21 may be electrically coupled to the first transistor T1 through a first contact hole CT1, and the second electrode 22 may be electrically coupled to the second voltage line VL2 through a second contact hole CT2. For example, the first electrode 21 may contact (e.g., physically contact) the first conductive pattern CDP through the first contact hole CT1 penetrating the first planarization layer 19 in the portion extending in the first direction DR1 of the second bank BNL2. The second electrode 22 may also contact (e.g., physically contact) the second voltage line VL2 through the second contact hole CT2 penetrating the first planarization layer 19 In the portion extending in the first direction DR1 of the second bank BNL2. However, the present disclosure is not limited thereto. In another embodiment, the first contact hole CT1 and the second contact hole CT2 may be in the light emitting area EMA surrounded by the second bank BNL2 so as not to overlap the second bank BNL2.

Although it is illustrated in the drawings that one first electrode 21 and one second electrode 22 are provided for each sub-pixel PXn, the present disclosure is not limited thereto, and the number of first electrodes 21 and second electrodes 22 provided for each sub-pixel PXn may be greater. The first electrode 21 and the second electrode 22 in each sub-pixel PXn may not necessarily have a shape extending in one direction, and the first electrode 21 and the second electrode 22 may be in various suitable structures. For example, the first electrode 21 and the second electrode 22 may have a partially curved or bent shape, and one electrode may be arranged to surround the other electrode.

Each of the first electrode 21 and the second electrode 22 may be directly on the first banks BNL1. Each of the first electrode 21 and the second electrode 22 may be formed to have a larger width than the first bank BNL1. For example, each of the first electrode 21 and the second electrode 22 may cover the outer surface of the first bank BNL1. Each of the first electrode 21 and the second electrode 22 may be on the side surface of the first bank BNL1, and the interval between the first electrode 21 and the second electrode 22 may be narrower than the interval between the first banks BNL1. At least a part of the first electrode 21 and at least a part of the second electrode 22 are directly on the first planarization layer 19, so that the first electrode 21 and the second electrode 22 may be on the same plane. However, the present disclosure is not limited thereto. In some cases, each of the electrodes 21 and 22 may have a width smaller than that of the first bank BNL1. However, each of the electrodes 21 and 22 may cover at least one side surface of the first bank BNL1 to reflect light emitted from the light emitting element 30.

Each of the electrodes 21 and 22 may include a conductive material having high reflectance. For example, each of the electrodes 21 and 22 may include a metal such as silver (Ag), copper (Cu), and/or aluminum (Al) as the conductive material having high reflectance, and/or may include an alloy containing aluminum (Al), nickel (Ni), and/or lanthanum (La). Each of the electrodes 21 and 22 may reflect the light emitted from the light emitting element 30 and proceeding to the side surface of the first bank BNL1 in the upward direction of each sub-pixel PXn.

However, the present disclosure is not limited thereto, and each of the electrodes 21 and 22 may further include a transparent conductive material. For example, each of the electrodes 21 and 22 may include a material such as indium tin oxide (ITO), indium zinc oxide (IZO), and/or indium tin zinc Oxide (ITZO). In some embodiments, each of the electrodes 21 and 22 may have a structure in which one or more transparent conductive material layers and one or more metal layers having high reflectivity are stacked, or may be formed as one layer including them. For example, each of the electrodes 21 and 22 may have a stacked structure of ITO/Ag/ITO/, ITO/Ag/IZO, or ITO/Ag/ITZO/IZO.

The plurality of electrodes 21 and 22 may be electrically coupled to the light emitting elements 30, and a set or predetermined voltage may be applied to the electrodes 21 and 22 such that the light emitting elements 30 emit light. The plurality of electrodes 21 and 22 may be electrically coupled to the light emitting elements 30 through the contact electrodes CNE1 and CNE2, and may transmit electrical signals applied to the electrodes 21 and 22 to the light emitting elements 30 through the contact electrodes CNE1 and CNE2.

One of the first electrode 21 and the second electrode 22 may be electrically coupled to an anode electrode of the light emitting element 30, and the other thereof may be electrically coupled to a cathode electrode of the light emitting element 30. However, the present disclosure is not limited thereto, and vice versa.

Each of the electrodes 21 and 22 may be used to form an electric field in the sub-pixel PXn to align the light emitting element 30. The light emitting element 30 may be between the first electrode 21 and the second electrode 22 by an electric field formed on the first electrode 21 and the second electrode 22. The light emitting elements 30 of the display device 10 may be sprayed on the electrodes 21 and 22 through an inkjet printing process. When an ink including the light emitting elements 30 is sprayed on the electrodes 21 and 22, an alignment signal is applied to the electrodes 21 and 22 to form an electric field. The light emitting elements 30 dispersed in the ink may be aligned on the electrodes 21 and 22 by receiving an electrophoretic force by the electric field formed on the electrodes 21 and 22.

A first insulating layer PAS1 is on the first planarization layer 19. The first insulating layer PAS1 may cover the first banks BNL1, the first electrode 21, and the second electrode 22. The first insulating layer PAS1 may protect the first electrode 21 and the second electrode 22 and insulate (e.g., electrically insulate) them from each other. Further, the first insulating layer PAS1 may prevent or reduce damage to the light emitting elements 30 thereon from direct contact with other members.

In an embodiment, the first insulating layer PAS1 may include an opening OP partially exposing the first electrode 21 and the second electrode 22. Each opening OP may partially expose portions of the electrodes 21 and 22 on the upper surface of the first bank BNL1. Parts of the contact electrodes CNE1 and CNE2 may contact (e.g., physically contact) each of the electrodes 21 and 22 exposed through the opening OP.

A step may be formed in the first insulating layer PAS1 such that a part of the upper surface of the first insulating layer PAS1 is recessed between the first electrode 21 and the second electrode 22. For example, as the first insulating layer PAS1 covers the first electrode 21 and the second electrode 22, the upper surface thereof may be stepped according to the shape of each of the electrodes 21 and 22 thereunder. However, the present disclosure is not limited thereto.

A second bank BNL2 may be on the first insulating layer PAS1. The second bank BNL2 may be in a lattice pattern on the entire (or substantially the entire) surface of the display area DPA while including portions extending in the first direction DR1 and the second direction DR2 on a plane. The second bank BNL2 may be over the boundary of the respective sub-pixels PXn to distinguish neighboring sub-pixels PXn.

Further, the second bank BNL2 may surround the light emitting area EMA and the cut area CBA provided for each sub-pixel PXn to distinguish the light emitting area EMA and the cut area CBA. The first electrode 21 and the second electrode 22 may extend in the second direction DR2 across a portion of the second bank BNL2 extending in the first direction DR1. In the portion of the second bank BNL2 extending in the second direction DR2, the portion between the light emitting areas EMA may have a greater width than the portion between the cut areas CBA. Accordingly, the distance between the cut areas CBA may be smaller than the distance between the light emitting areas EMA.

The second bank BNL2 may be formed to have a greater height than the first bank BNL1. The second bank BNL2 may prevent or reduce overflow of ink to adjacent sub-pixels PXn in an inkjet printing process of the process of manufacturing the display device 10, so that inks in which different light emitting elements 30 are dispersed for each pixel PXn may be separated from each other not to be mixed with each other. The second bank BNL2, like the first bank BNL1, may include polyimide (PI), but the material thereof is not limited thereto.

The light emitting element 30 may be on the first insulating layer PAS1. The plurality of light emitting elements 30 may be arranged to be spaced apart from each other along the second direction DR2 in which the electrodes 21 and 22 extend, and may be aligned substantially in parallel (e.g., substantially in parallel) to each other. The light emitting element 30 may have a shape extending in one direction, and a direction in which each of the electrodes 21 and 22 extends may be substantially perpendicular to a direction in which the light emitting element 30 extends. However, the present disclosure is not limited thereto, and the light emitting element 30 may be extend obliquely at a set or predetermined angle without being perpendicular to the direction in which each of the electrodes 21 and 22 extends.

The light emitting elements 30 in each sub-pixel PXn may include light emitting layers ('36' in FIG. 4) containing different materials to emit light having different wavelengths to the outside. Accordingly, light of the first color, light of the second color, and light of the third color may be emitted from the first sub-pixel PX1, the second sub-pixel PX2, and the third sub-pixel PX3, respectively. However, the present disclosure is not limited thereto, and each of the sub-pixels PXn includes the same type (or kind) of light emitting elements 30 to emit light of substantially the same color.

The light emitting element 30 may have both ends on each of the electrodes 21 and 22 between the first banks BNL1. The elongated length of the light emitting element 30 is longer than the distance between the first electrode 21 and the second electrode 22, and both ends of the light emitting element 30 may be on the first electrode 21 and the second electrode 22, respectively. For example, the light emitting element 30 may be arranged such that one end thereof is placed on the first electrode 21 and the other end thereof is placed on the second electrode 22.

The light emitting element 30 may be provided with (e.g., include) a plurality of layers in a direction perpendicular (e.g., substantially perpendicular) to the upper surface of the first substrate 11 or the first planarization layer 19. The light emitting element 30 is arranged such that one extending direction is parallel (e.g., substantially parallel) to the upper surface of the first planarization layer 19, and the plurality of semiconductor layers included in the light emitting element 30 may be sequentially arranged along a direction parallel (e.g., substantially parallel) to the upper surface of the first planarization layer 19. However, the present disclosure is not limited thereto, and when the light emitting element 30 has a different structure, the plurality of semiconductor layers may be arranged in a direction perpendicular (e.g., substantially perpendicular) to the upper surface of the first planarization layer 19.

Both ends of the light emitting element 30 may contact the contact electrodes CNE1 and CNE2, respectively. For example, the light emitting element 30 may not be provided with (e.g., may not include) an insulating film (38 in FIG. 4) on the end surface in one direction, and a part of the semiconductor layer may be exposed, and the exposed semiconductor layer may contact (e.g., physically contact) the contact electrodes CNE1 and CNE2. However, the present disclosure is not limited thereto, and at least a part of the insulating film 38 may be removed, so that both side surfaces of the semiconductor layers may be partially exposed. The exposed side surfaces of the semiconductor layers may directly contact (e.g., physically contact) the contact electrodes CNE1 and CNE2.

A second insulating layer PAS2 may be partially on the light emitting element 30. For example, the second insulating layer PAS2 may have a width smaller than the length of the light emitting element 30 and be on the light emitting element 30 so as to expose both ends of the light emitting element 30 while surrounding the light emitting element 30. The second insulating layer PAS2 may cover the light emitting element 30, the electrodes 21 and 22, and the first insulating layer PAS1 during the process of manufacturing the display device 10, and then may be removed to expose both ends of the light emitting element 30. The second insulating layer PAS2 may extend in the second direction DR2 on the first insulating layer PAS1 on the plane, thereby forming a linear or island-shaped pattern in each sub-pixel PXn. The second insulating layer PAS2 may protect the light emitting element 30 and fix the light emitting element 30 in the process of manufacturing the display device 10.

A plurality of contact electrodes CNE1 and CNE2 and a third insulating layer PAS3 may be on the second insulating layer PAS2.

The plurality of contact electrodes CNE1 and CNE2 may have a shape extending in one direction, and may be on each of the electrodes 21 and 22. The contact electrodes CNE1 and CNE2 may include a first contact electrode CNE1 on the first electrode 21 and a second contact electrode CNE2 on the second electrode 22. The contact electrodes CNE1 and CNE2 may be spaced apart from each other or face each other. For example, the first contact electrode CNE1 and the second contact electrode CNE2 may be on the first electrode 21 and the second electrode 22, respectively, and may be spaced apart from each other in the first direction DR1. Each of the contact electrodes CNE1 and CNE2 may form a stripe pattern in the light emitting area EMA of each sub-pixel PXn.

Each of the plurality of contact electrodes CNE1 and CNE2 may contact (e.g., physically contact) the light emitting element 30. The first contact electrode CNE1 may contact (e.g., physically contact) one end of the light emitting element 30, and the second contact electrode CNE2 may contact (e.g., physically contact) the other end of the light emitting element 30. In the light emitting element 30, a semiconductor layer is exposed on both end surfaces in an extending direction, and the contact electrodes CNE1 and CNE2 may be in electrical contact with the semiconductor layer of the light emitting element 30. One side of each of the contact electrodes CNE1 and CNE2 in contact (e.g., physically contact) with both ends of the light emitting element 30 may be on the second insulating layer PAS2. The first contact electrode CNE1 may contact (e.g., physically contact) the first electrode 21 through an opening OP exposing a part of the upper surface of the first electrode 21, and the second contact electrode CNE2 may contact (e.g., physically contact) the second electrode 22 through an opening OP exposing a part of the upper surface of the second electrode 22.

The width of each of the contact electrodes CNE1 and CNE2 measured in one direction may be smaller than the width of each of the electrodes 21 and 22 measured in the one direction. Each of the contact electrodes CNE1 and CNE2 may contact (e.g., physically contact) one end and the other end of the light emitting element 30 and cover a part of the upper surface of each of the first electrode 21 and the second electrode 22. However, the present disclosure is not limited thereto, and the contact electrodes CNE1 and CNE2 may be formed to have larger widths than the electrodes 21 and 22 to cover both sides of the electrodes 21 and 22.

The contact electrodes CNE1 and CNE2 may include a transparent conductive material. For example, the contact electrodes CNE1 and CNE2 may include ITO, IZO, ITZO, and/or aluminum (Al). The light emitted from the light emitting element 30 may pass through the contact electrodes CNE1 and CNE2 and proceed toward the electrodes 21 and 22. However, the present disclosure is not limited thereto.

Although it is shown in the drawings that two contact electrodes CNE1 and CNE2 are in one sub-pixel PXn, the present disclosure is not limited thereto. The number of contact electrodes CNE1 and CNE2 may be changed or varied depending on the number of electrodes 21 and 22 provided for each sub-pixel PXn.

The third insulating layer PAS3 may cover the first contact electrode CNE1. The third insulating layer PAS3 may include a first contact electrode CNE1 to cover one side on which the first contact electrode CNE1 is located based on the second insulating layer PAS2. The third insulating layer PAS3 may cover one side on which the first contact electrode CNE1 is located based on the second insulating layer PAS2 in addition to the first contact electrode CNE1. For example, the third insulating layer PAS3 may cover the first insulating layers PAS1 on the first contact electrode CNE1 and the first electrode 21. Such an arrangement may be formed by a process of partially removing an insulating material layer to form the second contact electrode CNE2 after entirely placing the insulating material layer forming the third insulating layer PAS3 in the light emitting area EMA. In the above process, the insulating material layer forming the third insulating layer PAS3 may be removed together with the insulating material layer forming the second insulating layer PAS2, and one side of the third insulating layer PAS3 may be aligned with one side of the second insulating layer PAS2. One side of the second contact electrode CNE2 may be on the third insulating layer PAS3, and the second contact electrode CNE2 may be insulated (e.g., electrically insulated) from the first contact electrode CNE1 with the third insulating layer PAS3 therebetween.

A fourth insulating layer PAS4 may be entirely on the display area DPA of the first substrate 11. The fourth insulating layer PAS4 may function to protect members on the first substrate 11 from external environments. However, the fourth insulating layer PAS4 may be omitted.

Each of the above-described first insulating layer PAS1, second insulating layer PAS2, third insulating layer PAS3, and fourth insulating layer PAS4 may include an inorganic insulating material and/or an organic insulating material. For example, each of the first insulating layer PAS1, the second insulating layer PAS2, the third insulating layer PAS3 and the fourth insulating layer PAS4 may include an inorganic insulating layer such as silicon oxide (SiOx), silicon nitride (SiNx), silicon oxynitride (SiOxNy), aluminum oxide ($Al_2O_3$), and/or aluminum nitride (AlN). In some embodiments, each of the first insulating layer PAS1, the second insulating layer PAS2, the third insulating layer PAS3 and the fourth insulating layer PAS4 may include an organic insulating layer such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the present disclosure is not limited thereto.

Figure 4:
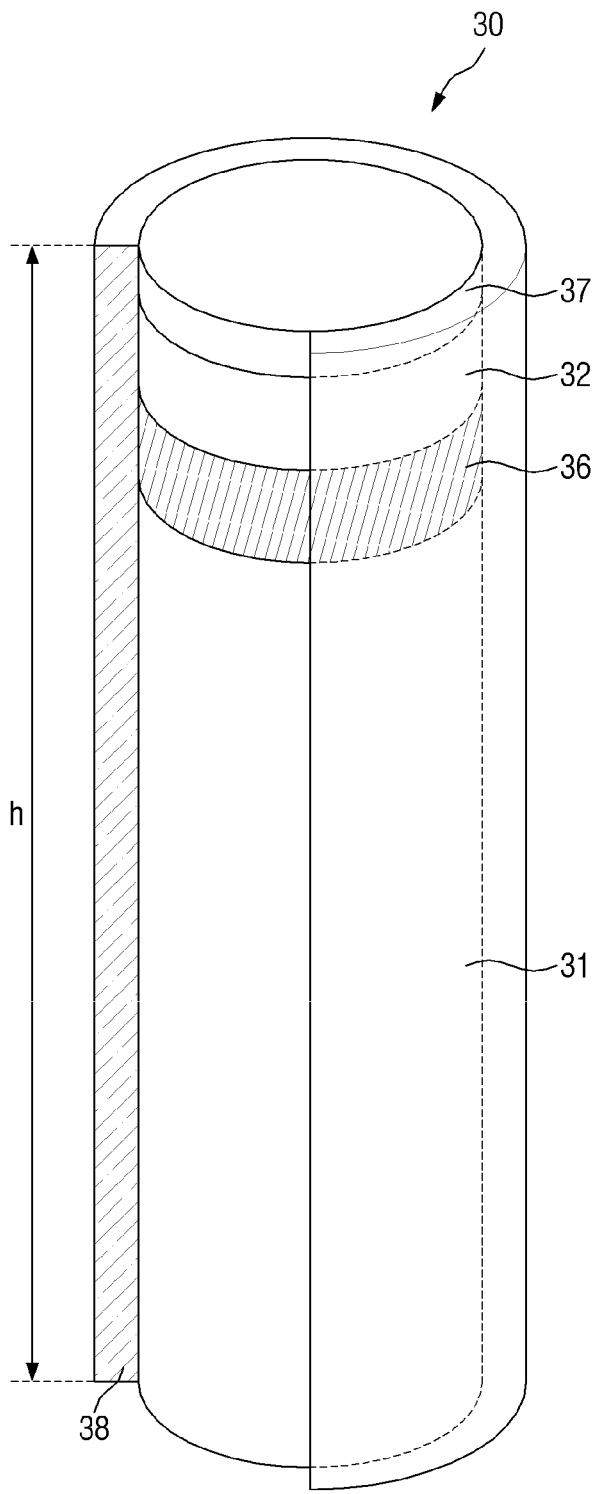
FIG. 4 is a schematic partial cutaway view of a light emitting element according to an embodiment.

FIG. 4 is a schematic view of a light emitting element according to an embodiment.

The light emitting element 30 may be a light emitting diode. In some embodiments, the light emitting element 30 may be an inorganic light emitting diode having a size of a micrometer or a nanometer and made of an inorganic material. When an electric field is formed between two electrodes facing each other in a set or predetermined direction, the organic light emitting diode may be aligned between the two electrodes having polarity (e.g., having respective polarities that are different from each other). The light emitting element 30 may be aligned between the two electrodes by the electric field formed on the two electrodes.

The light emitting element 30 may have a shape extending in one direction. The light emitting element 30 may have a shape of a cylinder, a rod, a wire, or a tube. However, the shape of the light emitting element 30 is not limited thereto, and the light emitting element 30 may have various suitable shapes such as a cube, a cuboid, or a hexagonal column, or may have a shape extending in one direction and having a partially inclined outer surface. A plurality of semiconductors included in the light emitting element 300 to be further described herein below may be sequentially arranged or stacked in one direction.

The light emitting element 30 may include semiconductor layers doped with any conductive type (for example, p-type or n-type) impurity. The semiconductor layers may receive an electrical signal applied from an external power source and emit light having a set or specific wavelength band.

Referring to FIG. 4, the light emitting element 30 may include a first semiconductor layer 31, a second semiconductor layer 32, a light emitting layer 36, an electrode layer 37, and an insulating film 38.

The first semiconductor layer 31 may be an n-type semiconductor layer. When the light emitting element 300 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may be at least one of AlGaInN, GaN, AlGaN, InGaN, AlN, and InN, each being doped with n-type impurities. The first semiconductor layer 31 may be doped with an n-type dopant. The n-type dopant may be Si, Ge, or Sn. For example, the first semiconductor layer 31 may be n-GaN doped with n-type Si. The length of the first semiconductor layer 31 may be in a range of 1.5 μm to 5 μm, but is not limited thereto.

The second semiconductor layer 32 is on the light emitting layer 36 to be further described herein below. The second semiconductor layer 32 may be a p-type semiconductor layer. When the light emitting element 30 emits light of a blue wavelength band or a green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may be at least one of AlGaInN, GaN, AlGaN, InGaN, AlN, and/or InN, each being doped with p-type impurities. The second semiconductor layer 32 may be doped with a p-type dopant. The p-type dopant may be Mg, Zn, Ca, Se, or Ba. For example, the second conductive semiconductor 320 may be p-GaN doped with p-type Mg. The length of the second semiconductor layer 32 may be in a range of 0.05 µm to 0.10 µm, but is not limited thereto.

Although it is shown in FIG. 4 that each of the first semiconductor layer 31 and the second semiconductor layer 32 is formed as one layer, the present disclosure is not limited thereto. Each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 is between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately stacked. The light emitting layer 36 may emit light by way of the combination (or recombination) of electron-hole pairs (e.g., through formation of excitons) according to an electrical signal applied through the first semiconductor layer 31 and the second semiconductor layer 32. When the light emitting layer 36 emits light of a blue wavelength band, the light emitting layer 36 may include a material such as AlGaN and/or AlGaInN. In some embodiments, when the light emitting layer 36 has a multiple quantum well structure in which quantum layers and well layers are alternately stacked, the quantum wells may include a material such as AlGaN and/or AlGaInN, and the well layers may include a material such as GaN and/or AlInN. For example, the light emitting layer 36 includes quantum wells each containing AlGaInN and well layers each containing AlInN, and thus the light emitting layer 36 may emit blue light having a central wavelength band of 450 nm to 495 nm as described above.

However, the present disclosure is not limited thereto, and the light emitting layer 36 may have a structure in which semiconductor materials having high bandgap energy and semiconductor materials having low bandgap energy are alternately stacked, and may include other group 3 to group 5 semiconductor materials depending on the wavelength bad of light. The light emitted from the light emitting layer 36 is not limited to light of a blue wavelength band, and in some cases, the light emitting layer 36 may emit light of a red or green wavelength band. The length of the light emitting layer 36 may have a range of 0.05 µm to 0.10 µm, but is not limited thereto.

In some embodiments, the light emitted from the light emitting layer 36 may be emitted to both side surfaces of the light emitting element 30 as well as the longitudinal outer surface of the light emitting element 30. The direction of the light emitted from the light emitting layer 36 is not limited to one direction.

The electrode layer 37 may be an ohmic contact electrode. However, the present disclosure is not limited thereto, and the electrode layer 37 may be a Schottky contact electrode (e.g., an electrode formed by a junction of a semiconductor and a metal). The light emitting element 30 may include at least one electrode layer 37. Although it is shown in FIG. 4 that the light emitting element 30 includes one electrode layer 37, the present disclosure is not limited thereto. In some cases, the light emitting element 30 may include a larger number of electrode layers 37, or the electrode layer 37 may be omitted. A description of the light emitting element 30 to be further described herein below may be equally applied even if the number of electrode layers 37 is changed or the light emitting element 30 further includes other structures.

When the light emitting element 30 is electrically coupled to an electrode or a contact electrode in the display device 10 according to an embodiment, the electrode layer 37 may reduce resistance between the light emitting element 30 and the electrode or the contact electrode. The electrode layer 37 may include a conductive metal. For example, the electrode layer 37 may include at least one selected from aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. The electrode layer 37 may include the same (or substantially the same) material, and may include different materials from each other, but the present disclosure is not limited thereto.

The insulating film 38 may surround the outer surfaces of the above-described semiconductor layers and electrode layers. For example, the insulating film 38 may surround at least the outer surface of the light emitting layer 36, and may extend in one direction in which the light emitting element 30 extends. The insulating film 38 may function to protect the members. For example, the insulating film 38 may be formed to surround the side surfaces of the members, and may be formed such that both ends of the light emitting element 30 in a length direction are exposed.

Figure 5:
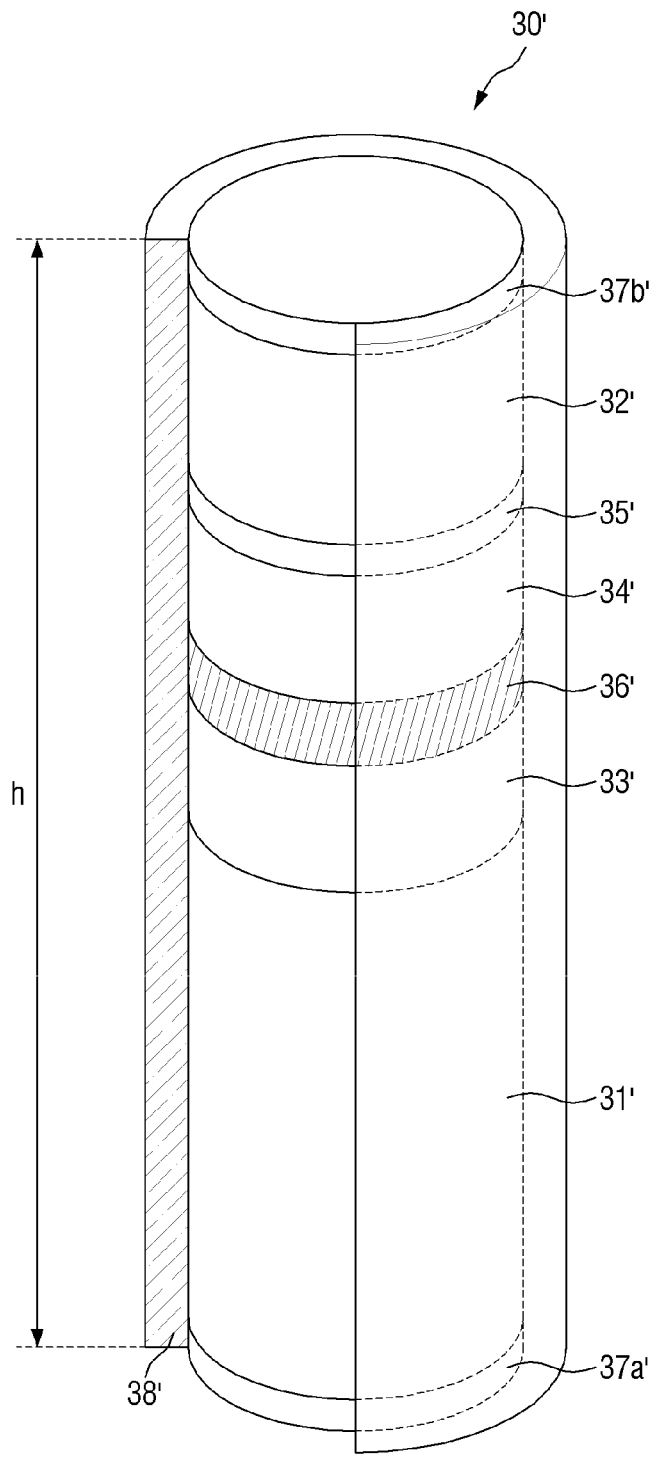
FIGS. 5 and 6 are schematic partial cutaway views of light emitting elements according to other embodiments.

Although it is shown in FIG. 5 that the insulating film 38 may extend in the length direction of the light emitting element 30 to cover the first semiconductor layer 31 to the side surface of the electrode layer 37, the present disclosure is not limited thereto. The insulating film 38 may cover only the outer surface of a part of the semiconductor layer as well as the active layer 330 or cover only a part of the outer surface of the electrode layer 37 to expose a part of the outer surface of the electrode layer 37. The insulating film 38 may be formed to have a cross-sectional upper surface in an area adjacent to at least one end of the light emitting element 30.

The thickness of the insulating film 38 may have a range of 10 nm to 1.0 µm, but is not limited thereto. In some embodiments, the thickness of the insulating film 38 may be about 40 nm.

The insulating film 38 may include a material having insulating properties, for example, silicon oxide (SiOx), silicon nitride (SiNx), silicon oxynitride (SiOxNy), aluminum nitride (AlN), and/or aluminum oxide ($Al_2O_3$). Thus, the light emitting layer 36 may prevent (or reduce a likelihood or degree of) an electrical short that may occur when the light emitting layer 36 is in direct contact (e.g., physical contact) with an electrode through which an electrical signal is transmitted to the light emitting element 30. Further, because the insulating film 380 protects the outer surface of the light emitting element 30 as well as the light emitting layer 36, it is possible to prevent or reduce the deterioration in light emission efficiency.

Further, the outer surface of the insulating film 38 may be surface-treated. The light emitting elements 30 may be aligned by being sprayed onto the electrodes in a state in which they are dispersed in a set or predetermined ink. Here, the surface of the insulating film 38 may be hydrophobically or hydrophilically treated in order to maintain the light emitting elements 300 in a dispersed state without being aggregated with other adjacent light emitting elements 30 in the ink. For example, the outer surface of the insulating film 38 may be surface-treated with a material such as stearic acid and/or 2,3-naphthalene dicarboxylic acid.

The length h of the light emitting element 30 may be in a range of 1 µm to 10 µm or 2 µm to 6 µm, and, for example, 3 µm to 5 µm. The diameter of the light emitting element 30 may be in a range of 300 nm to 700 nm, and the aspect ratio of the light emitting element 30 may be in a range of 1.2 to 100. However, the present disclosure is not limited thereto, and the plurality of light emitting elements 30 included in the display device 10 may have different diameters according to the composition difference of the light emitting layer 36. In some embodiments, the diameter of the light emitting element 30 may be about 500 nm.

The shape and material of the light emitting element 30 is not limited to those shown in FIG. 4. In some embodiments, light emitting element 30 may include a larger number of layers, or may have a different shape.

Figure 6:
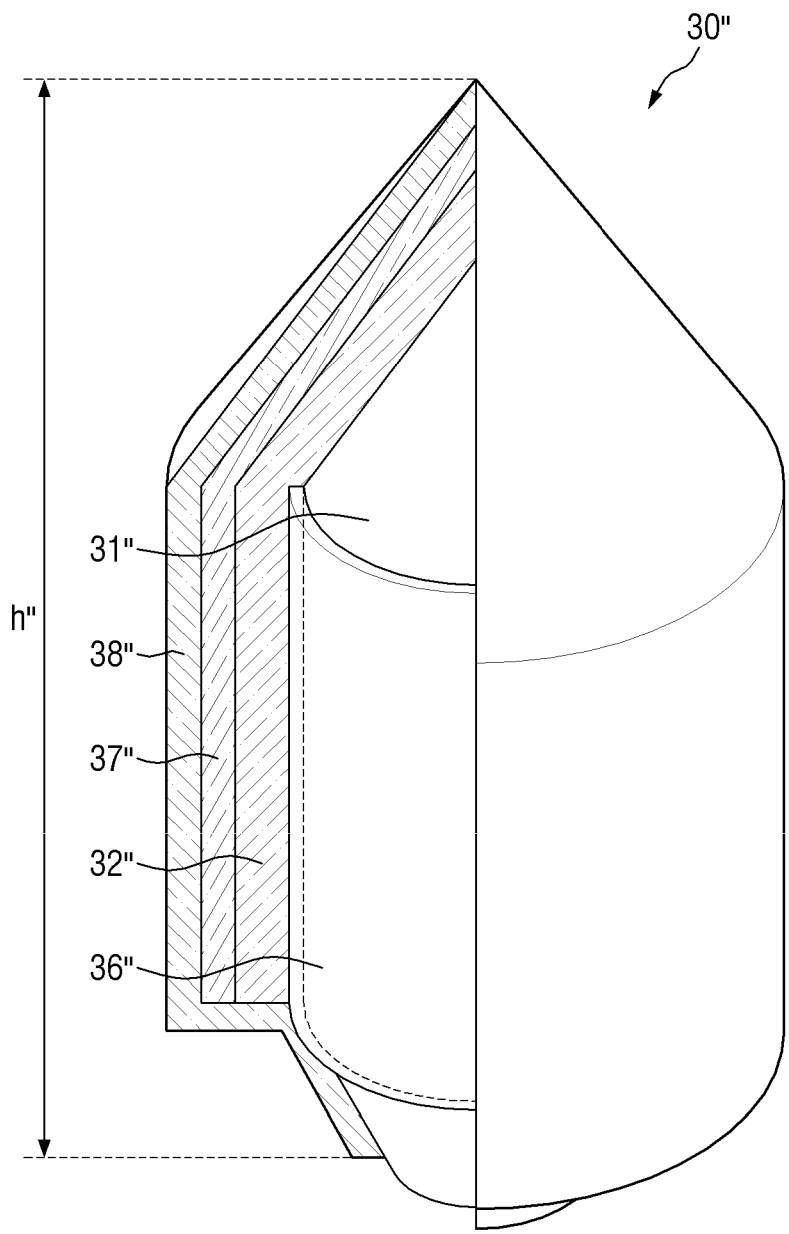

FIGS. 5 and 6 are schematic views of light emitting elements according to other embodiments.

First, referring to FIG. 5, a light emitting element 30' according to an embodiment further includes a third semiconductor layer 33' between a first semiconductor layer 31' and a light emitting layer 36', and a fourth semiconductor layer 34' and a fifth semiconductor layer 35' between a light emitting layer 36' and a second semiconductor layer 32'. The light emitting element 30' of FIG. 5 is different from the light emitting element 30 of FIG. 4 in that the plurality of semiconductor layers 33', 34', 35' and a plurality of electrode layers 37a' and 37b' are further provided, and the light emitting layer 36' contains different elements. The light emitting element 30' also includes an insulating film 38'. Hereinafter, descriptions duplicative of those provided above may not be repeated here, and differences will be mainly described.

In the light emitting element 30 of FIG. 4, the light emitting layer 36 may include nitrogen (N) to emit blue or green light. In contrast, in the light emitting element 30' of FIG. 5, the light emitting layer 36' and other semiconductor layers may be semiconductor layers each including at least phosphorus (P). The light emitting element 30' according to an embodiment may emit red light having a center wavelength band in a range of from 620 nm to 750 nm. However, it should be understood that the central wavelength band of red light is not limited to the above-described range, and includes all suitable wavelength ranges that can be recognized as red in the art.

In some embodiments, the first semiconductor layer 31' is an n-type semiconductor layer, and may include a semiconductor material having a chemical formula of $In_xAl_yGa_{1-x-y}P$ ($0 \leq x \leq 1$, $0 \leq y \leq 1$, $0 \leq x+y \leq 1$). The first semiconductor layer 31' may include at least one selected from InAlGaP, GaP, AlGaP, InGaP, AlP, and InP, which are doped with n-type impurities. For example, the first semiconductor layer 31' may include n-AlGaInP doped with n-type Si.

The second semiconductor layer 32' is a p-type semiconductor layer, and may include a semiconductor material having a chemical formula of $In_xAl_yGa_{1-x-y}P$ ($0 \leq x \leq 1$, $0 \leq y \leq 1$, $0 \leq x+y \leq 1$). The second semiconductor layer 32' may include at least one selected from InAlGaP, GaP, AlGaNP, InGaP, AlP, and InP, which are doped with p-type impurities. For example, the second semiconductor layer 32' may include p-GaP doped with p-type Mg.

The light emitting layer 36' may be between the first semiconductor layer 31' and the second semiconductor layer 32'. The light emitting layer 36' may include a material having a single or multiple quantum well structure to emit light having a set or specific wavelength band. When the light emitting layer 36' has a multiple quantum well structure in which quantum layers and well layers are alternately stacked, the quantum layer may include a material such as AlGaP and/or AlInGaP, and the well layer may include a material such as GaP and/or AlInP. For example, the light emitting layer 36' may include the quantum layer including AlGaInP and the well layer including AlInP to emit red light having a central wavelength band of 620 nm to 750 nm.

The light emitting element 30' of FIG. 5 may include a clad layer adjacent to the light emitting layer 36'. As shown in FIG. 5, the third semiconductor layer 33' and the fourth semiconductor layer 34' between the first semiconductor layer 31' and the second semiconductor layer 32' and on and beneath the light emitting layer 36' may be clad layers.

The third semiconductor layer 33' may be between the first semiconductor layer 31' and the light emitting layer 36'. The third semiconductor layer 33', like the first semiconductor layer 31', may be an n-type semiconductor layer, and may include a semiconductor material having a chemical formula of $In_xAl_yGa_{1-x-y}P$ ($0 \leq x \leq 1$, $0 \leq y \leq 1$, $0 \leq x+y \leq 1$). For example, the first semiconductor layer 31' may include n-AlGaInP, and the third semiconductor layer 33' may include n-AlInP.

The fourth semiconductor layer 34' may be between the light emitting layer 36' and the second semiconductor layer 32'. The fourth semiconductor layer 34', like the second semiconductor layer 32', may be a p-type semiconductor layer, and may include a semiconductor material having a chemical formula of $In_xAl_yGa_{1-x-y}P$ ($0 \leq x \leq 1$, $0 \leq y \leq 1$, $0 \leq x+y \leq 1$). For example, the second semiconductor layer 32' may include p-GaP, and the fourth semiconductor layer 34' may include p-AlInP.

The fifth semiconductor layer 35' may be between the fourth semiconductor layer 34' and the second semiconductor layer 32'. The fifth semiconductor layer 35', like the second semiconductor layer 32' and the fourth semiconductor layer 34', may be a p-type semiconductor layer. In some embodiments, the fifth semiconductor layer 35' may function to reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include p-GaInP, p-AlInP, and/or p-AlGaInP, but the material thereof is not limited thereto. The length of each of the third semiconductor layer 33', the fourth semiconductor layer 34', and the fifth semiconductor layer 35' may be in a range of 0.08 µm to 0.25 µm, but is not limited thereto.

The first electrode layer 37a' and the second electrode layer 37b' may be on the first semiconductor layer 31' and the second semiconductor layer 32', respectively. The first electrode layer 37a' may be on the lower surface of the first semiconductor layer 31', and the second electrode layer 37b' may be on the upper surface of the second semiconductor layer 32'. However, the present disclosure is not limited thereto, and at least one of the first electrode layer 37a' and the second electrode layer 37b' may be omitted. For example, in the light emitting element 30', the first electrode layer 37a' may not be on the lower surface of the first semiconductor layer 31', and only one second electrode layer 37b' may be on the upper surface of the second semiconductor layer 32'.

Subsequently, referring to FIG. 6, a light emitting element 30'' may have a shape extending in one direction, an may have a partially inclined side surface. For example, the light emitting element 30''' according to an embodiment may have a partially conical shape.

The light emitting element 30" may be formed such that a plurality of layers are not stacked in one direction, and each layer surrounds the outer surface of another layer. The light emitting element 30" may include a semiconductor core having at least some regions extending in one direction and an insulating film 38" formed to surround the semiconductor core. The semiconductor core may include a first semiconductor layer 31", a light emitting layer 36", a second semiconductor layer 32", and an electrode layer 37".

The first semiconductor layer 31" may extend in one direction, and both end portions thereof may be formed to be inclined toward the centers thereof. The first semiconductor layer 31" may include a rod-shape or cylindrical body portion, and upper and lower end portions having inclined side surfaces and respectively formed on and under the body portion. The upper end portion of the body portion may have a steeper slope than the lower end portion.

The light emitting layer 36" may surround the outer surface of the body portion of the first semiconductor layer 31". The light emitting layer 36" may have an annular shape extending in one direction. The light emitting layer 36" may not be formed on the upper and lower end portions of the first semiconductor layer 31". However, the present disclosure is not limited thereto. The light emitted from the light emitting layer 36" may be emitted to both side surfaces of the light emitting element 30" in a length direction as well as to both ends of the light emitting element 30" in the length direction. Compared to the light emitting element 30 of FIG. 4, the light emitting element 30" of FIG. 6 has the light emitting layer 36" having a large area, and may thus emit a larger amount of light.

The second semiconductor layer 32" may surround the outer surface of the light emitting layer 36" and the upper end portion of the first semiconductor layer 31". The second semiconductor layer 32" may include an annular body portion extending in one direction and an upper end portion having an inclined side surface. For example, the second semiconductor layer 32" may directly contact (e.g., physically contact) the parallel side surface of the light emitting layer 36" and the inclined upper end portion of the first semiconductor layer 31". However, the second semiconductor layer 32" is not formed on the lower end portion of the first semiconductor layer 31".

The electrode layer 37" may surround the outer surface of the second semiconductor layer 32". The shape of the electrode layer 37" may be substantially the same as the shape of the second semiconductor layer 32". The electrode layer 37" may entirely contact (e.g., entirely physically contact) the outer surface of the second semiconductor layer 32".

The insulating film 38" may surround the outer surfaces of the electrode layer 37" and the first semiconductor layer 31". The insulating film 38" may directly contact (e.g., physically contact) the lower end portion of the first semiconductor layer 31" and the exposed lower portions of the light emitting layer 36" and the second semiconductor layer 32" as well as the electrode layer 37"

The light emitting elements 30 may be sprayed onto each of the electrodes 21 and 22 through an inkjet printing process. The light emitting elements 30 may be dispersed in a solvent to be prepared in an ink state and sprayed onto the electrodes 21, 22, and may be between the electrodes 21 and 22 through a process of applying an alignment signal to the electrodes 21 and 22. When an alignment signal is applied to each of the electrodes 21 and 22, an electric field is formed thereon, and the light emitting element 30 may receive a dielectrophoretic force by the electric field to align the light emitting elements 30. The light emitting element 30 having received the dielectrophoretic force may be on the first electrode 21 and the second electrode 22 while the alignment direction and position are changed.

The light emitting element 30 may include a plurality of semiconductor layers, and may be generally made of a material having a specific gravity greater than that of a solvent. When the light emitting elements 30 are dispersed and stored in a solvent, the dispersion may be maintained for a set or predetermined period of time and then gradually precipitated due to a specific gravity difference. When the light emitting elements 30 are precipitated in the solvent, the number of light emitting elements 30 per ink droplet is not uniform. Therefore, when manufacturing a device including the light emitting element 30 using the ink, the number of light emitting elements 30 for each area is not constant, and thus, the quality of products may be deteriorated or reduced.

According to an embodiment, the ink including the light emitting elements 30 further includes a thickener (500 in FIG. 7), and thus, viscosity of the ink may change according to a shear stress applied to the solution. The ink including the light emitting elements 30 has a high viscosity in a state in which the ink is stored in a container, or in a state in which no shear stress is applied, and thus, the light emitting elements 30 may be stored in a dispersed state for a long time. Further, the ink including the light emitting elements 30 has a low viscosity in a state in which the ink is discharged through a nozzle in an inkjet printing process, or in a state in which a shear stress is applied, and thus, the ink may be easily discharged through the nozzle. Therefore, according to an embodiment, the ink including the light emitting elements 30 may be sprayed by including a uniform number of light emitting elements 30 in a unit area through a printing process while preventing or reducing precipitation of the light emitting element 30. Hereinafter, the ink including the light emitting elements 30 will be further described.

Figure 7:
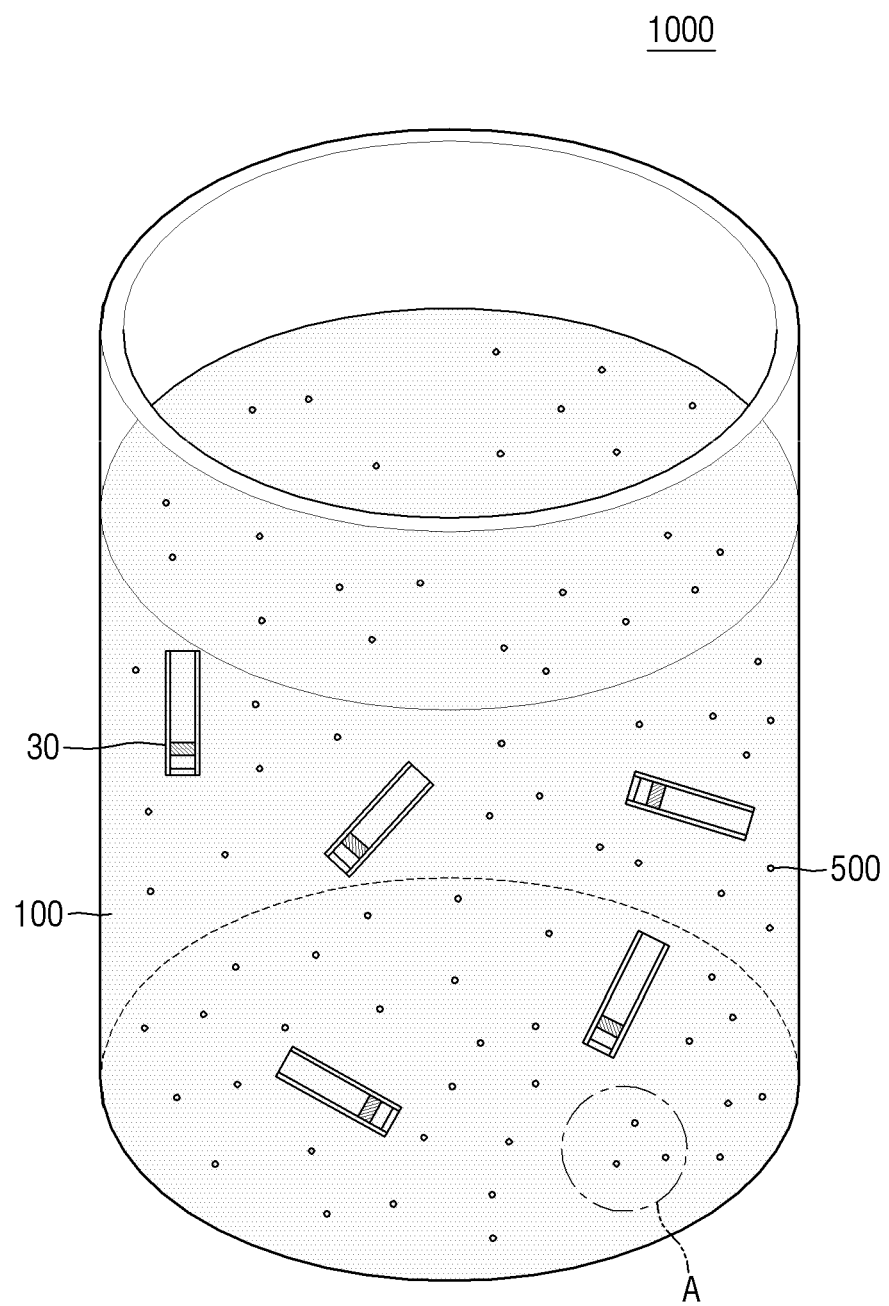
FIG. 7 is a schematic view of a light emitting element ink according to an embodiment.

FIG. 7 is a schematic view of a light emitting element ink according to an embodiment.

Referring to FIG. 7, a light emitting element ink 1000 according to an embodiment includes a light emitting element solvent 100, light emitting elements 30 dispersed in the light emitting element solvent 100, and thickeners 500. The light emitting element 30 may be any one selected from the light emitting elements 30, 30', and 30" described above with reference to FIGS. 4 to 6, and the light emitting element 30 of FIG. 4 is illustrated in the drawings. Because the description of the light emitting element 30 is the same as that described above, the light emitting element solvent 100 and the thickener 500 will be described in more detail herein below.

The light emitting element solvent 100 may store (or solubilize) the light emitting elements 30 having a high specific gravity, including semiconductor layers, in a dispersed state, and may be an organic solvent that does not react (or does not substantially react) with the light emitting elements 30. The light emitting element solvent 100 may have a viscosity suitable or sufficient to be discharged through a nozzle of an inkjet printing apparatus in a liquid state. The solvent molecules of the light emitting element solvent 100 may disperse the light emitting elements 30 while surrounding the light emitting elements 30 on the surface thereof. The light emitting element ink 1000 may include the light emitting elements 30 to be prepared in a solution or colloid state. In an embodiment, examples of the light emitting element solvent 100 may include, but are not limited to, acetone, water, alcohol, toluene, propylene glycol (PG), propylene glycol methyl acetate (PGMA), triethylene glycol monobutyl ether (TGBE), diethylene glycol monophenyl ether (DGPE), amide-based solvents, dicarbonyl-based solvents, diethylene glycol dibenzoate, tricarbonyl-based solvents, triethyl citrate, phthalate-based solvents, benzyl butyl phthalate, bis(2-ethylhexyl) phthalate, bis(2-ethylhexyl) isophthalate, bis(2-ethylhexyl) isophthalate, and ethylphthalyl ethyl glycolate.

In the present specification, the "light emitting element solvent 100" refers to a solvent in which the light emitting elements 30 can be dispersed, or a medium thereof, and the "solvent molecule 101" refers to one molecule that constitutes the light emitting element solvent 100. As will be further described herein below, it may be understood that the "light emitting element solvent 100" is a liquid medium including the solvent molecules 101. However, these terms may not necessarily be used separately, and in some cases, the "light emitting element solvent 100" and the "solvent molecule 101" are used interchangeably, but may be substantially the same.

The thickeners 500 may be dispersed in the light emitting element solvent 100 together with the light emitting elements 30. A set or predetermined amount of the thickeners 500 is included in the light emitting element ink 1000 to change the viscosity of the solution according to the state of the light emitting element ink 1000. According to an embodiment, the thickener 500 may include a functional group capable of forming a hydrogen bond to form an intermolecular hydrogen bond. The thickener 500 may form a hydrogen bond between the solvent molecules 101 or the thickeners 500 of the light emitting element solvent 100 to form a relatively strong attraction force between different molecules. For example, a compound of the thickeners 500 may be hydrogen bonded to a compound of the solvent or another compound of the thickeners 500.

Figure 8:
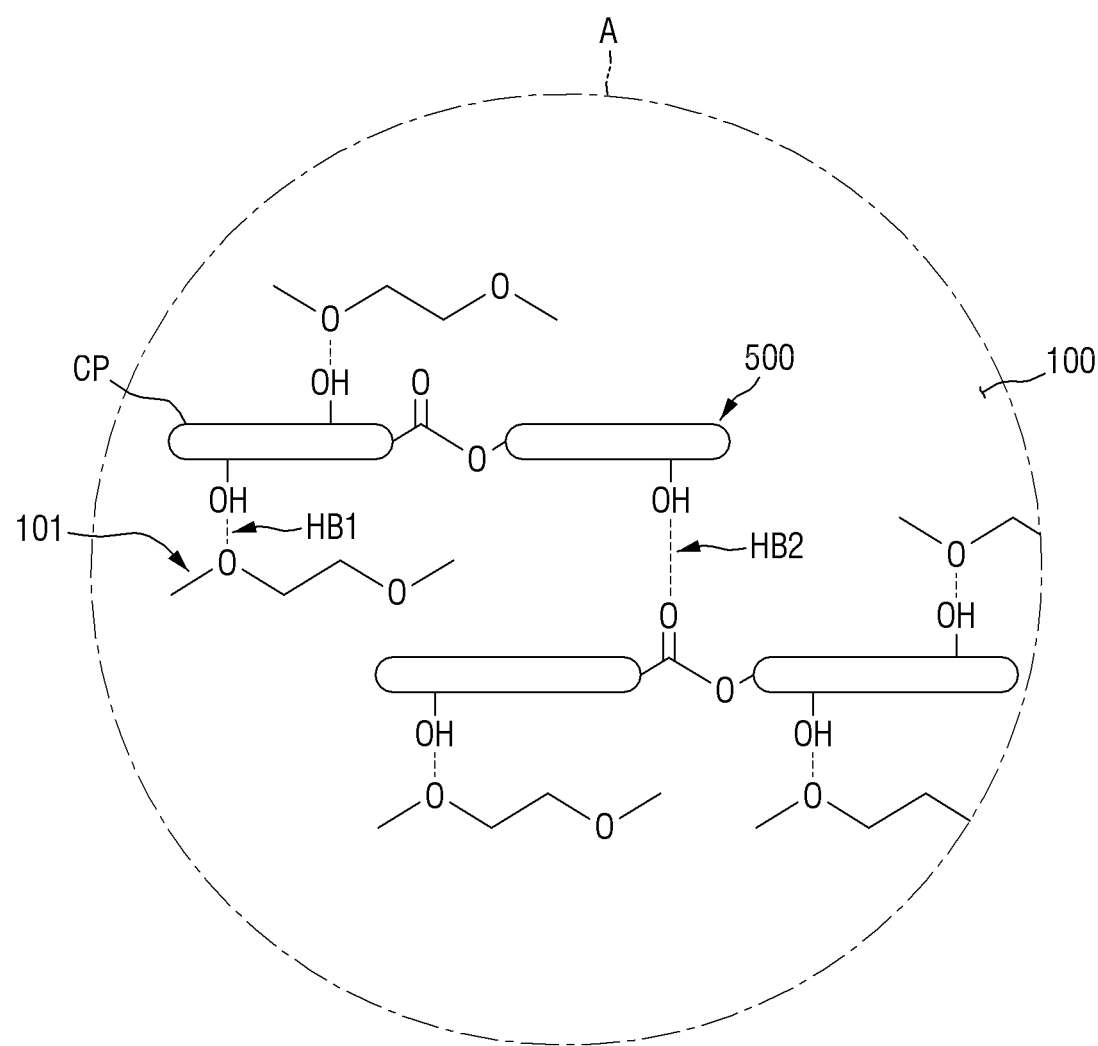
FIG. 8 is a schematic view illustrating a bond between a thickener and a light emitting element solvent in a storage state of a portion A of the light emitting element ink of FIG. 7.

FIG. 8 is a schematic view illustrating a bond between a thickener and a light emitting element solvent in a storage state of a portion A of the light emitting element ink of FIG. 7. FIG. 8 illustrates the form of a molecule of the thickener 500 dispersed in the light emitting element solvent 100 in a state in which a shear stress is not applied in a state of the light emitting element.

Referring to FIG. 8, the thickener may include a first functional group such as a hydroxy group (—OH) and/or an amine group (—NH$_2$), which includes hydrogen (H), as a functional group capable of forming a hydrogen bond, and a second functional group such as a carbonyl group (—CO—), an ester group (—COO—), an amine group (—NH—), an amino group (—CONH—), a urea group (—NHCONH—), and/or a urethane group (—NHCOO—), as a functional group capable of forming a hydrogen bond with hydrogen (H) included in another molecule. Although it is shown in the drawing that the thickener 500 includes a hydroxy group (—OH) as the first functional group and an ester group (—COO—) as the second functional group, and the solvent molecule 101 of the light emitting element solvent 100 includes an ethylene glycol ether (—OCH$_2$CH$_2$O—) group, the present disclosure is not limited thereto.

The thickener 500 may include a main chain portion CP in which the first functional group and the second functional group are bonded, and the main chain portion CP may be bonded with the first functional group and the second functional group. The main chain portion CP may be a carbon chain such as an alkyl group, an alkenyl group, and/or an alkynyl group, but is not limited thereto, and may further include other functional groups such as an ether group (—O—). In one thickener 500, the first functional group including hydrogen (H) may form a hydrogen bond HB1 together with an atom having a non-covalent electron pair of the solvent molecule 101 of the light emitting element solvent 100 or the second functional group of the thickener 500, for example oxygen (O) or nitrogen (N). The second functional group of the thickener 500 may form a hydrogen bond (HB2) together with the first functional group of another thickener 500. According to an embodiment, the thickener 500 may form a hydrogen bond together with another molecule (e.g., a compound) of the thickener 500 and/or a molecule (e.g., a compound) of the solvent molecule 101, and may form a network structure between the main chain portion CP and the solvent molecule 101 and between the main chain portions CP of other thickeners 500 in a state in which a shear stress is not applied. The light emitting element ink 1000 may have a high viscosity due to the network structure formed by the thickeners 500, and the precipitation rate of the light emitting elements 30 may decrease in the storage state of the light emitting element ink 1000.

For example, the light emitting element ink 1000 may have a viscosity in a range of from 30 cP to 300 cP, measured at room temperature (25° C.) in a state in which no shear stress is applied. However, the present disclosure is not limited thereto. The viscosity of the light emitting element ink 1000 may be adjusted through the molecular structure and/or molecular weight of the thickener 500 as necessary or desired. However, in order to prevent or reduce the precipitation of the light emitting elements 30, the light emitting element ink 1000 may have a viscosity of at least 30 cP or more in a state in which no shear stress is applied. In the light emitting element ink 1000, the light emitting elements 30 may be kept in a dispersed state for a long time until a printing process using an inkjet printing apparatus.

According to an embodiment, the thickener 500 of the light emitting element ink 1000 may include a compound represented by Chemical Formula 1 below.

Chemical Formula 1

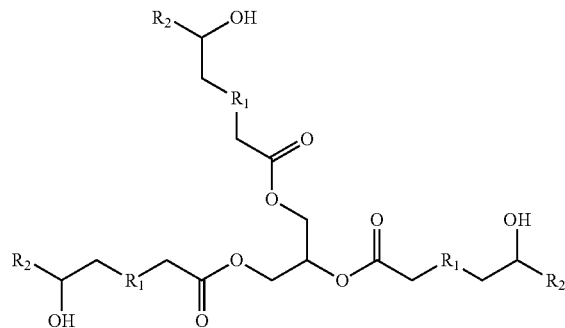

In Chemical Formula 1 above, the $R_1$s are each independently a substituted or unsubstituted alkyl group having 6 to 8 carbon atoms, an alkene group, an alkenyl group, or an alkynyl group, and the $R_2$s are each independently an alkyl group having 3 to 8 carbon atoms. The compound of Chemical Formula 1 includes a triester group formed by bonding —OH group of glycerol with ricinoleic acid. The thickener 500 according to an embodiment may have a structure in which a plurality of carbon chains each including an alcohol (—OH) group capable of forming a hydrogen bond are bonded to each other. In the thickener 500, carbon chains each including an alcohol (—OH) group may be bonded to each other through a triester group, and the hydroxyl group (—OH) included in ricinoleic acid and the oxygen atom of the triester group may form hydrogen bonds with different molecules (e.g., other compounds). For example, the hydroxyl group (—OH) of the ricinoleic acid may form a hydrogen bond (HB1) with oxygen (O) included in the solvent molecule 101 of another thickener 500 or the light emitting element solvent 100, and the double bond oxygen (O) of the triester group may form a hydrogen bond (HB2) with a hydroxyl group (—OH) of another thickener 500. The thickener 500 may form a network structure through a hydrogen bond between molecules in a storage state in which a shear stress is not applied, and the light emitting element ink 1000 may have a high viscosity.

In Chemical Formula 1 above, R1 and R2 may be variously changed depending on the molecular weight and/or the like of the thickener 500. For example, $R_1$ may be an unsubstituted alkyl group having 6 to 8 carbon atoms, an alkene group having several double bonds, or an alkyl group having 6 to 8 carbon atoms and substituted with a halogen group, an ethoxy group, a thiol group, or a sulfanyl ethanol group. In an exemplary embodiment, the thickener 500 may include a compound represented by any one selected from Chemical Formulas 2 to 6 below.

Chemical Formula 2

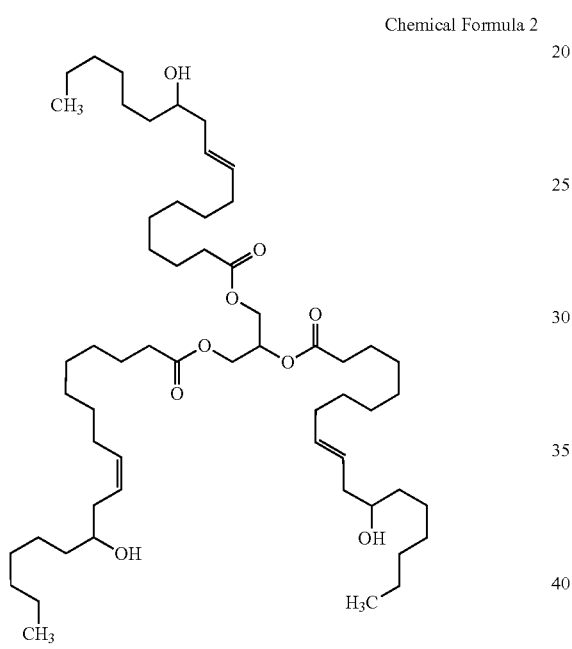

Chemical Formula 3

Chemical Formula 4

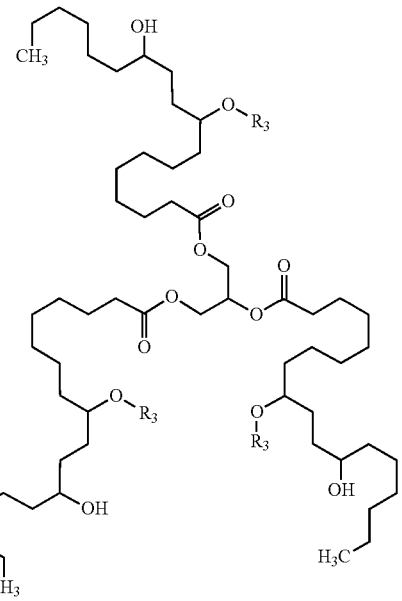

Chemical Formula 5

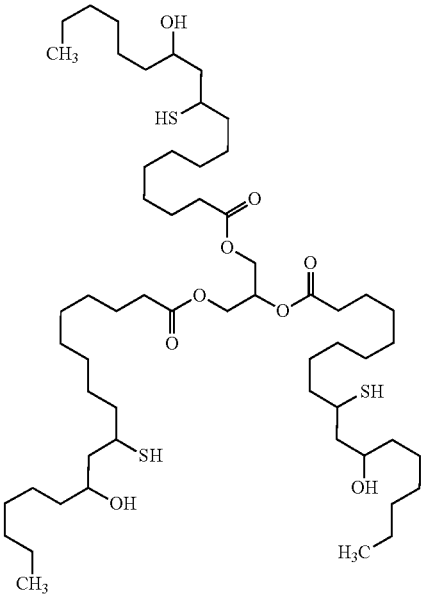

-continued

Chemical Formula 6

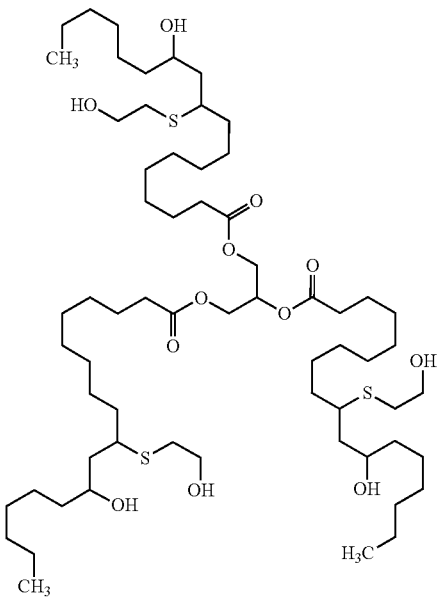

In Chemical Formula 4 above, $R_3$ is *—$(CH_2CH_2O)xCH_3$ (here, x is an integer of 7 to 112, and —* means a bond with an oxygen atom (O)).

Chemical Formula 2 illustrates an embodiment where $R_1$ of Chemical Formula 1 is an unsubstituted alkene group, and Chemical Formulae 3 to 6 illustrate embodiments where $R_1$ of Chemical Formula 1 is an alkene group substituted with bromine (Br), thiol (—SH), sulfanylethanol (—$SHCH_2CH_2OH$), or ethoxy (—$(CH_2CH_2O)xCH_3$). Further, Chemical Formulae 3 to 6 illustrate embodiments where $R_2$ of Chemical Formula 1 is an unsubstituted alkyl group having 6 carbon atoms. Chemical Formulae 3 to 6 may each have a structure in which a plurality of carbon chains each including an alcohol group are connected to each other through a triester group, and each of the carbon chains is substituted with another functional group. However, the structure of the thickener 500 is not limited to Chemical Formulas 2 to 6. If the thickener 500 has a structure in which a plurality of carbon chains each including an alcohol group are connected to each other, within the disclosed ranges, the types (or compositions) of R1 and R2 of Chemical Formula 1 and substituent bonded thereto may be variously changed. Further, in Chemical Formula 4 above, x of may be any one selected from 7 to 112, for example, x may be any one selected from 7, 12, 16, 44 and 112.

In some embodiments, a shear stress may be applied to the solvent 100 while the light emitting element ink 1000 is discharged through a nozzle or flows in an inkjet head of the inkjet printing apparatus. The shear stress may have a stronger intensity than the intermolecular hydrogen bond of the thickener 500, and the hydrogen bonds HB1 and HB2 may break. The thickeners 500 do not form a network structure with the solvent molecules 101 of the light emitting element solvent 100 or other thickeners 500, and thus the light emitting element ink 1000 may have a low viscosity. For example, the application of the shear stress to the light emitting element ink may break, disrupt, or cleave the respective intermolecular hydrogen bonds between the compound of the thickener and the compound of the light emitting element solvent and/or the other compound of the thickener, such that the respective intermolecular hydrogen bonds are no longer present to form the network structure.

Figure 9:
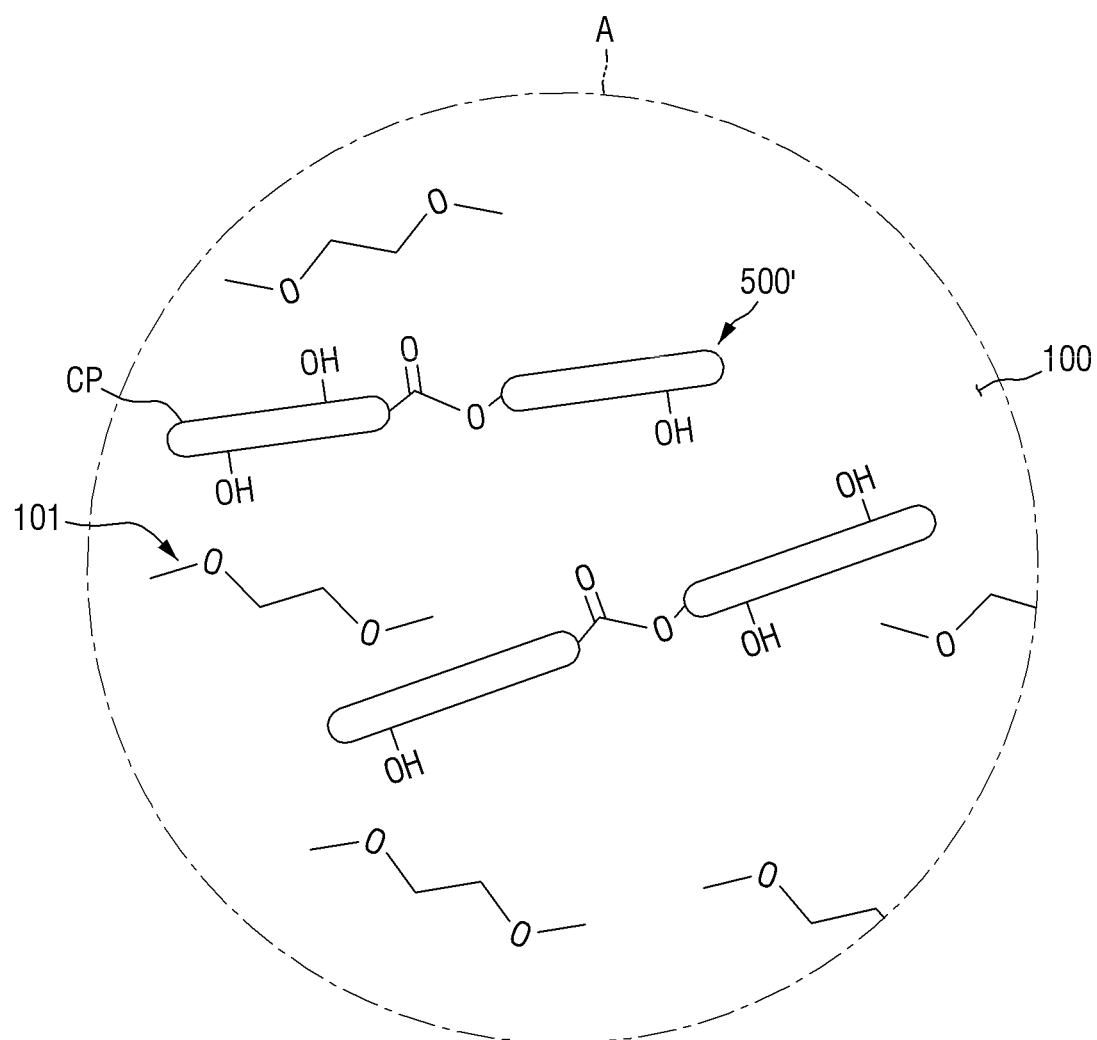
FIG. 9 is a schematic view illustrating a bond between a thickener and a light emitting element solvent in a printing state of a portion A of the light emitting element ink of FIG. 7.

FIG. 9 is a schematic view illustrating a bond between a thickener and a light emitting element solvent in a printing state of a portion A of the light emitting element ink of FIG. 7. FIG. 9 illustrates the form of an embodiment a molecule of the thickener 500' dispersed in the light emitting element solvent 100 in a state in which a shear stress is not applied when the light emitting element ink 1000 is printed.

Referring to FIG. 9, in the printing process of the light emitting element ink 1000, a shear stress may be applied to the light emitting element solvent 100 while the light emitting element ink 1000 flows in or from an inkjet head of an inkjet printing apparatus or is discharged through a nozzle of an inkjet printing apparatus. In the present specification, the "printing" of the light emitting elements 30 may means that the light emitting elements 30 are discharged or ejected to a set or predetermined object using an inkjet printing apparatus. For example, the "printing" of the light emitting elements 30 may mean that the light emitting elements 30 are discharged directly through a nozzle of the inkjet printing apparatus or are discharged in a stated in which the light emitting elements 30 are dispersed in the light emitting element ink 1000. However, the present disclosure is not limited thereto, and the "printing" of the light emitting elements 30 may mean that the light emitting elements 30 or the light emitting element ink 1000, in which the light emitting elements 30 are dispersed, are ejected onto a target substrate ('SUB' in FIG. 11) to allow the light emitting elements 30 or the light emitting element ink 1000 to be mounted on the target substrate SUB.

When the light emitting element ink 1000 is discharged through the nozzle of the inkjet printing apparatus, or in a state in which a shear stress is applied, the thickener 500' may not form a network structure. The shear stress applied in the printing process of the light emitting element ink 1000 may have a stronger intensity than each of the intermolecular hydrogen bonds HB1 and HB2 formed by the thickeners 500', and the thickeners 500' and the solvent molecules 101 of the light emitting element solvent 100 may be dispersed individually without forming a network structure.

According to an embodiment, the light emitting element ink 1000 may have a viscosity in a range of 5 cP to 15 cP or 7 cP to 13 cP, for example, about 10 cP, measured at room temperature (25° C.) in a state in which a shear stress is applied. However, the present disclosure is not limited thereto, and the viscosity of the light emitting element ink 1000 may be variously changed as long as the light emitting element ink 1000 can be discharged through the nozzle of the inkjet head. When the light emitting element ink 1000 has a viscosity within the above range, the light emitting element ink 1000 may be easily discharged through the nozzle, and the dispersion degree of the light emitting elements 30 may be maintained because a printing process is performed previously even if the light emitting elements 30 are gradually precipitated. For example, the number of light emitting elements 30 per unit droplet of the light emitting element ink 1000 discharged from the nozzle of the inkjet printing apparatus may be maintained uniformly.

The light emitting element ink 1000 may include a set or predetermined amount of light emitting elements 30 per unit weight, and the thickener 500' may be included in a set or predetermined content with respect to the weight of the light emitting elements 30. According to an embodiment, the light emitting element ink 1000 may include 100 to 500 parts by weight of the thickener 500' with respect to 100 parts by weight of the light emitting elements 30. When the thickener 500' is included in an amount of less than 100 parts by weight with respect to 100 parts by weight of the light emitting elements 30, an effect of preventing or reducing the precipitation of the light emitting elements 30 in the storage state may be insufficient or unsuitable, and when the thickener 500' is included in an amount of 500 parts by weight or more, the viscosity of the light emitting element ink 1000 is too high, and thus, the nozzle inlet may be blocked during the printing process. When the light emitting element ink 1000 includes the thickener 500' within the above range, the light emitting element ink 1000 may be smoothly discharged through the nozzle while preventing or reducing the precipitation of the light emitting elements 30.

The content of the light emitting elements 30 included in the light emitting element ink 1000 may be changed or varied depending on the number of the light emitting elements 30 per unit droplet of the light emitting element ink 1000 discharged through the nozzle during the printing process. In an embodiment, the light emitting elements 30 may be included in an amount in a range of 0.01 to 1 part by weight with respect to 100 parts by weight of the light emitting element ink 1000. However, this is an example, and the content of the light emitting elements 30 may vary depending on the number of light emitting elements 30 per unit droplet of the light emitting element ink 1000.

The light emitting element ink 1000 may further include a dispersant that improves the dispersion degree of the light emitting elements 30. The kind or composition of the dispersant is not particularly limited, and the dispersant may be added in an appropriate or suitable amount to further disperse the light emitting elements 30. For example, the dispersant may be included in an amount in a range of 10 to 50 parts by weight with respect to 100 parts by weight of the light emitting elements 30. However, the content of the dispersant is not limited thereto.

According to an embodiment, the light emitting element ink 1000 may include the thickener 500 to vary the viscosity of the light emitting element ink 100 during the process of manufacturing process the display device 10. The light emitting element ink 1000 may have a suitable viscosity for each storage stage of the light emitting element ink 1000 and each printing stage through a nozzle. In some embodiments, in the storage stage of the light emitting element ink 1000, as the light emitting element ink 1000 has a high viscosity, the precipitation of the light emitting elements 30 may be prevented or reduced, and in the printing stage through a nozzle, as the light emitting element ink 1000 has a low viscosity, the printing process of the light emitting elements 30 may be performed smoothly.

When manufacturing a product including the light emitting elements 30 using the light emitting element ink 1000 according to an embodiment, a uniform number of light emitting elements 30 may be provided for each unit area, and the light emitting element solvent 100 and the thickener 500, remaining as foreign matter, in a subsequent process may be completely removed. Accordingly, reliability of the product including the light emitting elements 30 may be improved. According to an embodiment, the display device 10 described above with reference to FIGS. 1 to 3 may be manufactured using the light emitting element ink 1000.

In the process of manufacturing the display device 10, a process of placing the light emitting elements 30 on the electrodes 21 and 22 may be performed, and this process may be formed through a printing process using the light emitting element ink 1000.

Hereinafter, a process of manufacturing the display device 10 according to an exemplary embodiment will be described with reference to the drawings.

Figure 10:
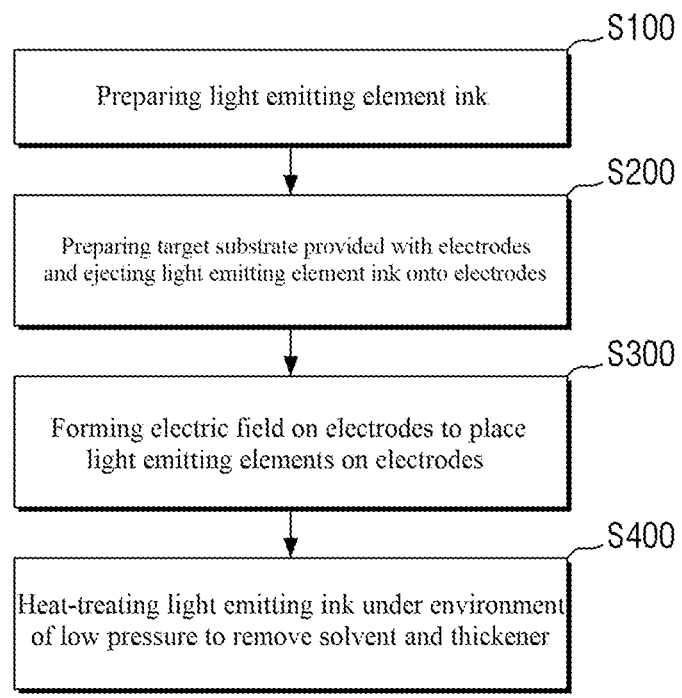
FIG. 10 is a flowchart illustrating a method of manufacturing a display device according to an embodiment.

FIG. 10 is a flowchart illustrating a method of manufacturing a display device according to an embodiment.

Referring to FIG. 10, a method of manufacturing a display device 10 according to an embodiment includes the active acts of: preparing a light emitting element ink 1000 including light emitting elements 30, a light emitting element solvent 100, and a thickener 500 (S100); preparing a target substrate SUB provided with (e.g., including) a plurality of electrodes 21 and 22 on the target substrate SUB and ejecting the light emitting element ink 1000 onto the electrodes 21 and 22 (S200); forming an electric field on the electrodes 21 and 22 to place the light emitting elements on the electrodes 21 and 22 (S300); and heat-treating the light emitting element ink 1000 under a low-pressure environment to remove the light element solvent 100 and the thickener 500 (S400).

The process of manufacturing the display device 10 includes: an active act of storing the light emitting element ink 1000 having a high viscosity not to precipitate the light emitting elements in a state in which a shear stress is not applied; and an active act of printing the light emitting element ink 1000 including the light emitting elements 30 to have a low viscosity in a state in which shear stress is applied. In the light emitting element ink 1000, viscosity may be changed during the storage stage and the printing stage, and the light emitting element ink 1000 may be easily printed on the target substrate SUB while preventing or reducing the precipitation of the light emitting elements. Hereinafter, the method of manufacturing the display device 10 will be described in more detail with reference to the drawings.

Figure 11:
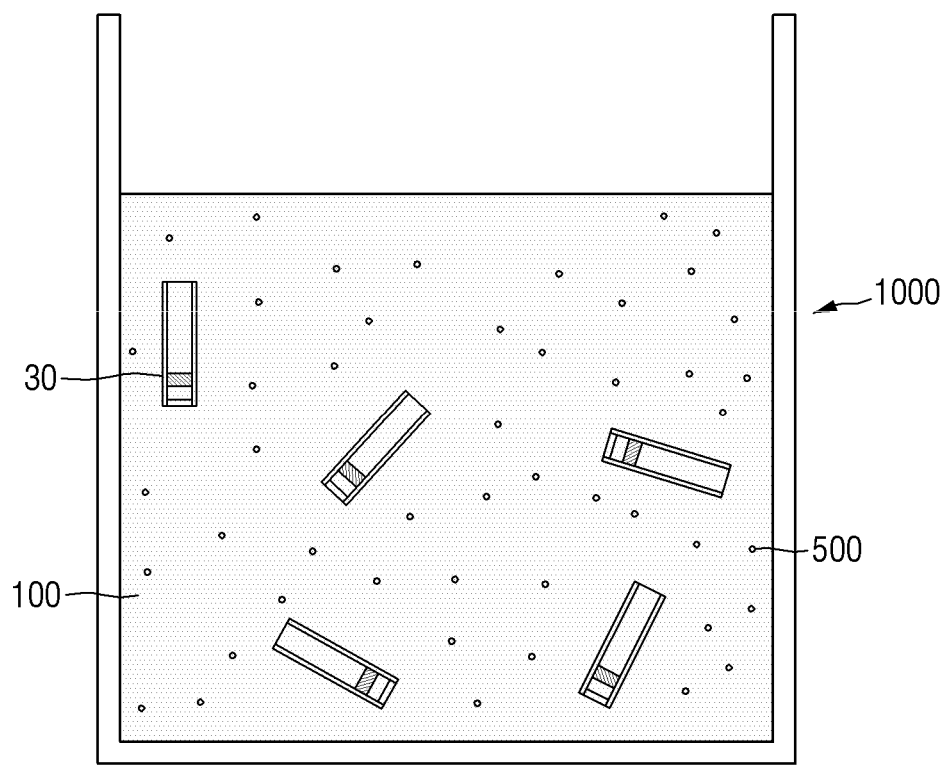
FIGS. 11 to 13 are cross-sectional views illustrating active acts in a process of manufacturing a display device according to an embodiment.
Figure 11:
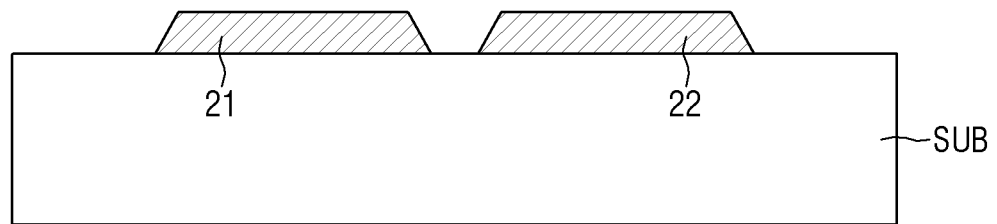
Figure 12:
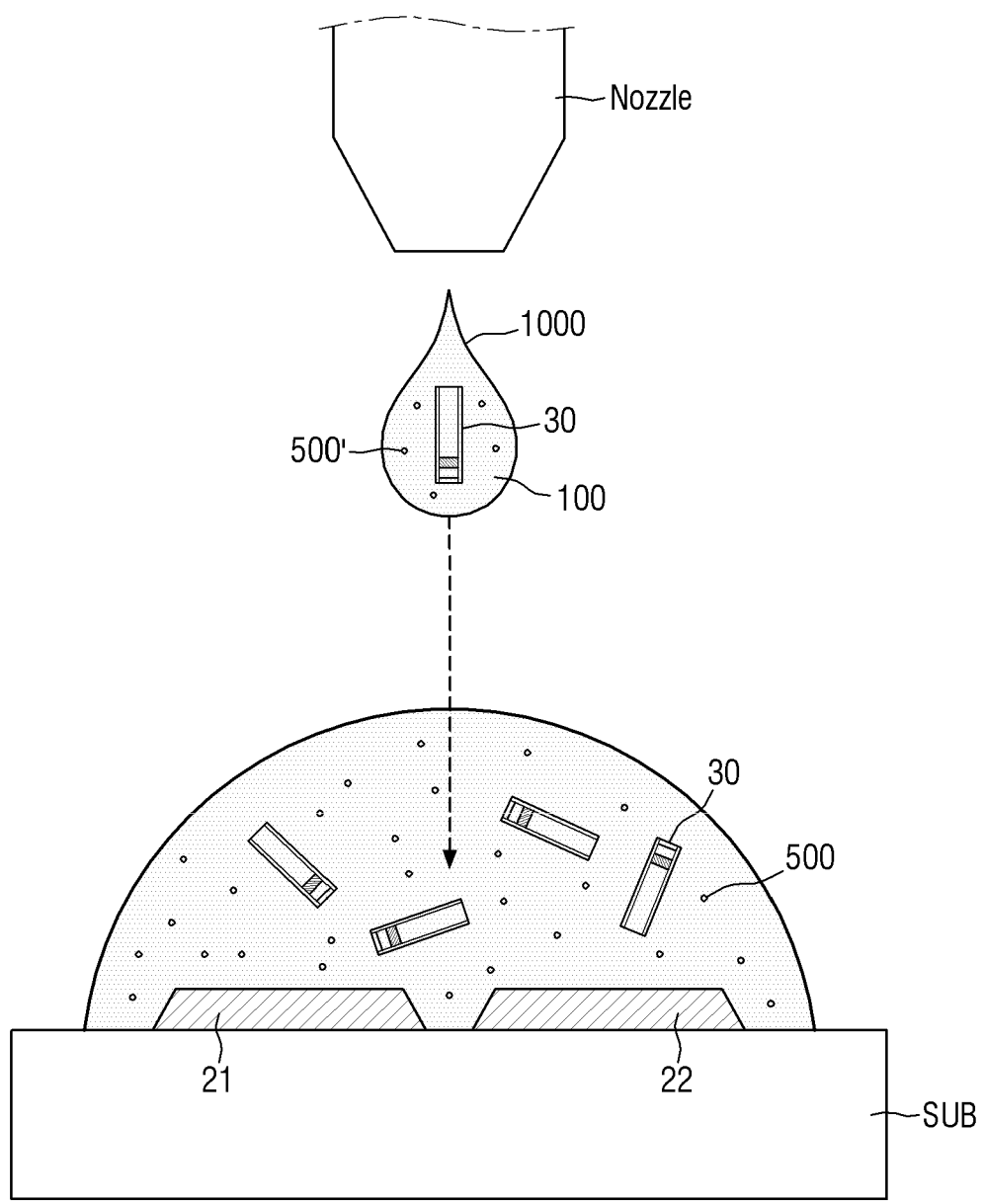
Figure 13:
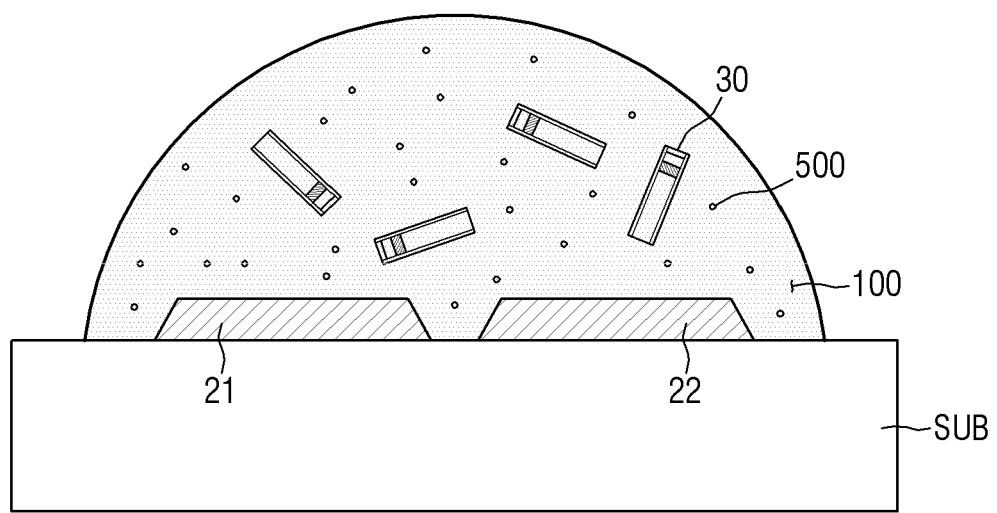

FIGS. 11 to 13 are cross-sectional views illustrating active acts in a process of manufacturing a display device according to an embodiment.

First, referring to FIG. 11, a light emitting element ink 1000 including light emitting elements 30, a light emitting element solvent 100, and a thickener 500, and a target substrate SUB provided with (e.g., including) a first electrode 21 and a second electrode 22 on the target substrate SUB are prepared. Although it is shown in the drawing that a pair of electrodes is on the target substrate SUB, a larger number of electrode pairs may be on the target substrate SUB. In some embodiments, the target substrate SUB may include a plurality of circuit elements on the first substrate 11 of the display device 10 in addition to the first substrate 11. Hereinafter, for convenience of description, these circuit elements will be omitted.

The light emitting element ink 1000 may include a solvent 100, light emitting elements 30 dispersed in the solvent, and a photodegradable thickener 500. The light emitting element ink 1000 stored in the container may be in a state in which there is no (or substantially no) flow of fluid, and a shear stress is not applied. The thickener 500 may form hydrogen bonds between molecules (e.g., compounds of the thickener 500) to form a three-dimensional network structure in the solvent 100. The light emitting element ink 1000 may have a high viscosity, for example, in a range of 30 cp to 300 cp, and the light emitting elements 30 may be maintained in a dispersed state for a long time.

The active act of preparing the light emitting element ink 1000 may be performed by a first dispersion process of mixing the light emitting elements 30, the light emitting element solvent 100, and a dispersant to prepare a solution and a second dispersion process of adding the thickener 500 to the solution prepared in the first dispersion process. For example, the first dispersion process is performed by mixing the light emitting elements 30 and the dispersant with the light emitting element solvent 100 and then stirring the solution for 5 minutes or more. As described above, the light emitting element 30 may have a diameter of 1 μm or less, or 500 nm or less, and a length in a range of 1 μm to 10 μm or about 4 μm or more. The light emitting elements 30 may be included in an amount in a range of 0.01 to 1 part by weight with respect to 100 parts by weight of the light emitting element ink 100, and the dispersant may be included in an amount in a range of 10 to 50 parts by weight with respect to 100 parts by weight of the light emitting elements 30. The mixing process may be performed by a sonication process, a stirring process, a milling process, and/or the like.

Subsequently, a second dispersion process in which a thickener 500 is further added to and mixed with the solution prepared in the first dispersion process is performed. The thickener 500 may be included in an amount in a range of 10 to 50 parts by weight with respect to 100 parts by weight of the light emitting elements 30. The mixing process may be performed by sequentially performing a sonication process and a stirring process for 5 minutes or more, respectively. In order for the thickener 500 to be mixed easily, the mixing process may be performed at a temperature higher than room temperature (25° C.), for example, at about 40° C. or higher.

The light emitting element ink 1000 prepared through the first and second dispersion processes may be stored at room temperature (25° C.). A compound of the thickener 500 of the light emitting element ink 1000 may form an intermolecular hydrogen bond with a compound of the light emitting element solvent 100 and/or another compound of the thickener 500, and the light emitting element ink 1000 may have a viscosity of at least 30 cP or more. The light emitting elements 30 may be maintained in a dispersed state with little precipitation.

Subsequently, referring to FIGS. 12 and 13, the light emitting element ink 1000 is sprayed onto the first electrode 21 and the second electrode 22 on the target substrate SUB. In an embodiment, the light emitting element ink 1000 may be sprayed onto the electrodes 21 and 22 through a printing process using an inkjet printing apparatus. The light emitting element ink 1000 may be ejected through a nozzle of an inkjet head included in an inkjet printing apparatus. The light emitting element ink 1000 may flow along an internal flow path provided in the inkjet head and be discharged onto the target substrate SUB through the nozzle. The light emitting element ink 1000 discharged from the nozzle may be attached onto the electrodes 21 and 22 on the target substrate SUB. The light emitting element 30 may have a shape extending in one direction, and may be dispersed in the light emitting element ink 1000 in a state in which the extending direction has a random alignment direction.

Before the light emitting element ink 1000 is ejected through a nozzle, a third dispersion process for redispersing the light emitting elements 30 and the thickener 500 may be performed. For example, the stored light emitting element ink 1000 may be subjected to a sonication process and/or a vortexing and/or stirring process for 5 minutes or more, respectively. Even if the light emitting element ink 1000 has a high viscosity, and thus, the light emitting elements 30 hardly precipitates, the third dispersion process for suitably or sufficiently dispersing the light emitting elements 30 may be performed before the printing process through the nozzle. Accordingly, the light emitting elements 30 of the light emitting element ink 1000 prepared in the inkjet printing apparatus may have a level of dispersion degree similar to that of the initial storage state.

When the light emitting element ink 1000 is prepared in the inkjet printing apparatus and discharged through a nozzle, a shear stress may be applied in a state in which there is a flow of fluid (the light emitting element ink 1000). In the light emitting element ink 1000 to which a shear stress is applied, the thickener 500 does not form an intermolecular hydrogen bond, and the thickener 500' does not form a three-dimensional network structure, and each chain may exist in a dispersed state in the light emitting element solvent 100. The light emitting element ink 1000 may have a low viscosity, for example, a viscosity in a range of about 5 cp to 15 cp, or about 10 cp, and may be easily discharged from a nozzle to prevent or reduce nozzle clogging due to the viscosity of the solution.

Figure 14:
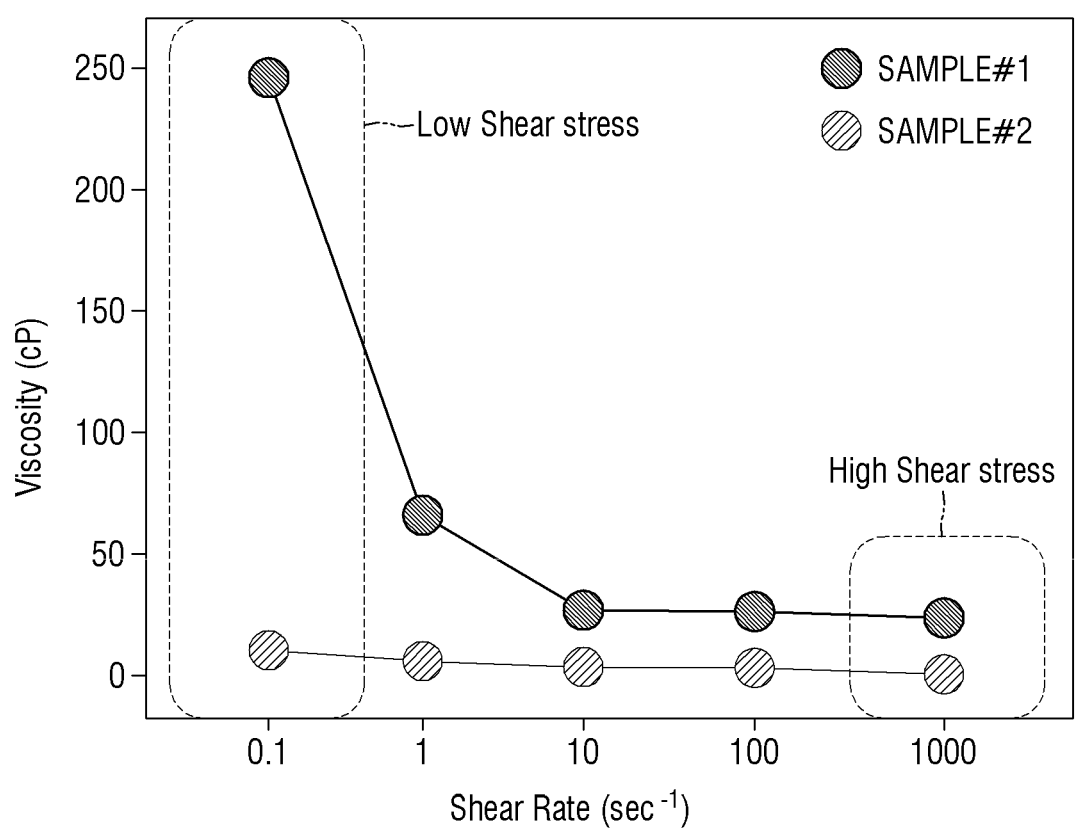
FIG. 14 is a graph illustrating a change in viscosity according to the application of shear stress of the light emitting element ink.

FIG. 14 is a graph illustrating a change in viscosity according to the application of a shear stress of the light emitting element ink. FIG. 14 illustrates a change in viscosity according to the intensity of a shear stress (shear rate, $sec^{-1}$) applied to the light emitting element ink including the thickener 500 (SAMPLE #1 in FIG. 14, Sample No. 1 below) and the light emitting element ink not including the thickener 500 (SAMPLE #2 in FIG. 14, Sample No. 2 below).

Referring to FIG. 14, each of sample 1 (SAMPLE #1) and sample 2 (SAMPLE #2) may have a low viscosity in a state in which the intensity of a shear stress is high ('High shear stress' in FIG. 14). When the intensity of a shear stress applied to sample 1 (SAMPLE #1) and sample 2 (SAMPLE #2) is about 1000 $sec^{-1}$, the viscosity thereof may be in a range of about 8 cP to 10 cP. The solution having a viscosity within the above range may be easily discharged through the nozzle, and the nozzle may not be blocked by the viscosity of the solution.

In contrast, sample 1 (SAMPLE #1) and sample 2 (SAMPLE #2) may have a different viscosity in a state in which the intensity of a shear stress is low ('Low shear stress' in FIG. 14). When the intensity of a shear stress is about 0.1 $sec^{-1}$, sample 1 (SAMPLE #1) may have a viscosity of 30 cP or more, for example, about 250 cP, as the thickener 500 forms a three-dimensional network structure. The light emitting elements 30 included in sample 1 (SAMPLE #1) are hardly precipitated, and may maintain an initial dispersion state. Because sample 2 (SAMPLE #2) does not include the thickener 500, sample 2 (SAMPLE #2) may have a viscosity of about 10 cP when the intensity of a shear stress is about 0.1 $sec^{-1}$. The light emitting elements 30 included in sample 2 (SAMPLE #2) may be precipitated without maintaining an initial dispersion state over time.

When performing a printing process using sample 2 (SAMPLE #2), the light emitting elements 30 may be precipitated, so that the number of light emitting elements 30 included per unit droplet of the solution may be less than the calculated value or may not be uniform per unit droplet. In contrast, when performing a printing process using sample 1 (SAMPLE #1), the light emitting elements 30 are dispersed almost without being precipitated, the number of light emitting elements 30 included per unit droplet may be uniform per unit droplet. In the method of manufacturing the display device 10 according to an embodiment, the display device 10 is manufactured using the light emitting element ink 1000 of sample 1 (SAMPLE #1), and the manufactured display device 10 has a uniform number of light emitting elements 30 provided per unit area, so that product reliability may be improved.

Subsequently, an electric field is formed in the light emitting element ink 1000 to place the light emitting elements on the electrodes 21 and 22, and the light emitting element solvent 100 and the thickener 500 are removed (S400).

Figure 15:
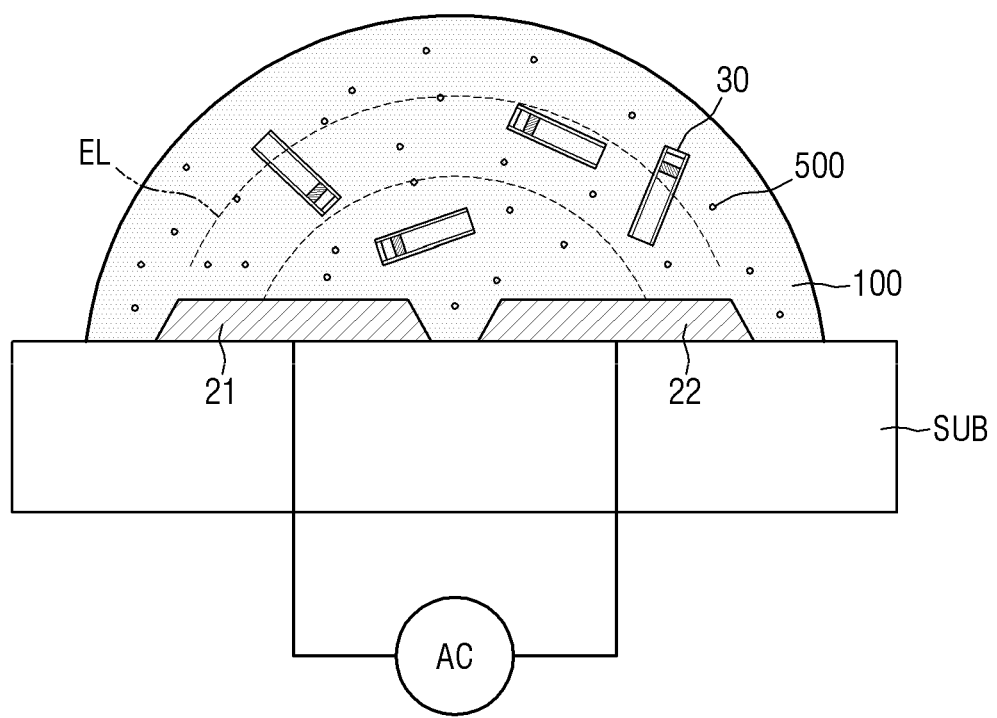
FIGS. 15 to 17 are cross-sectional views illustrating other active acts in a process of manufacturing a display device according to an embodiment.
Figure 16:
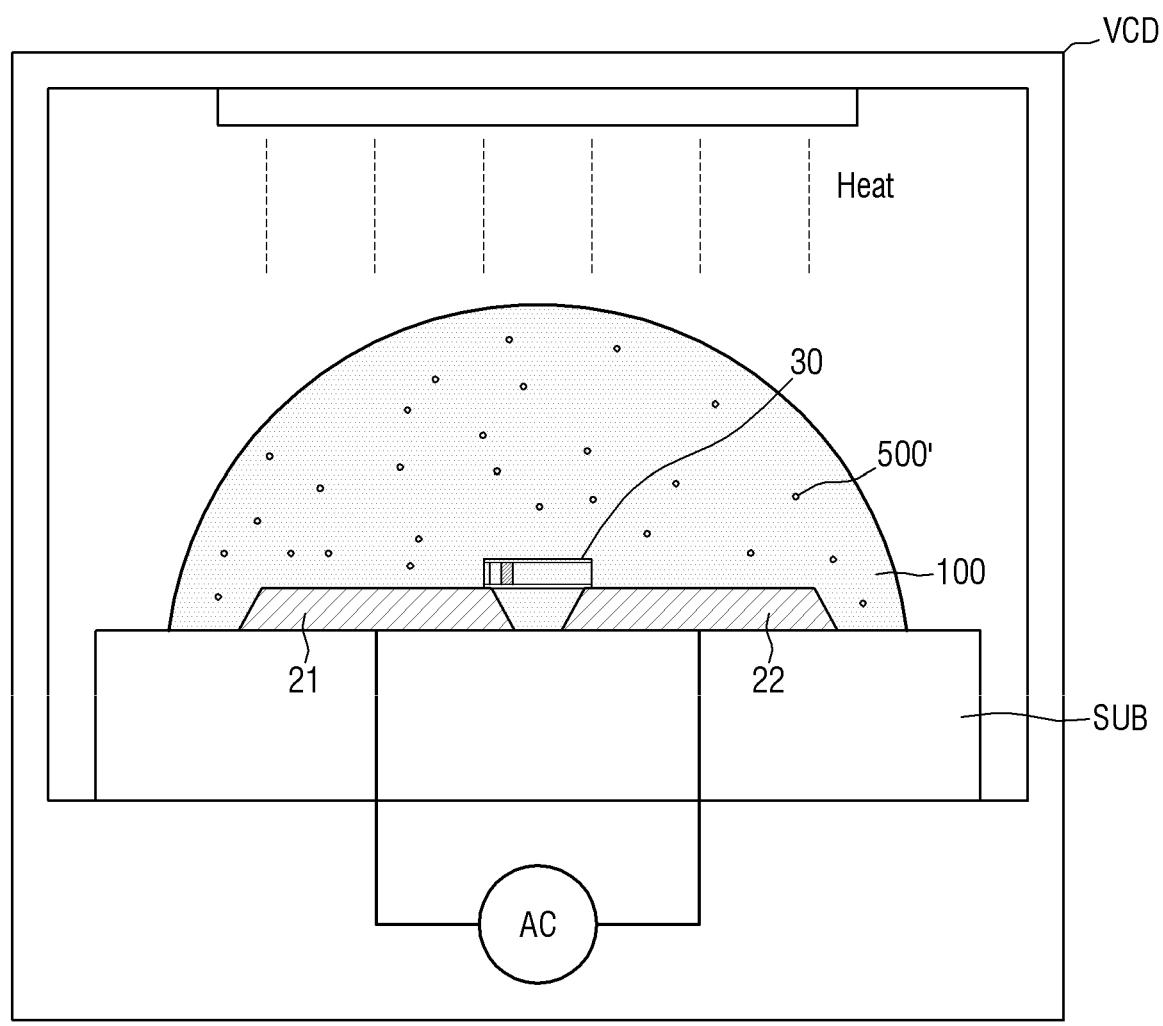
Figure 17:
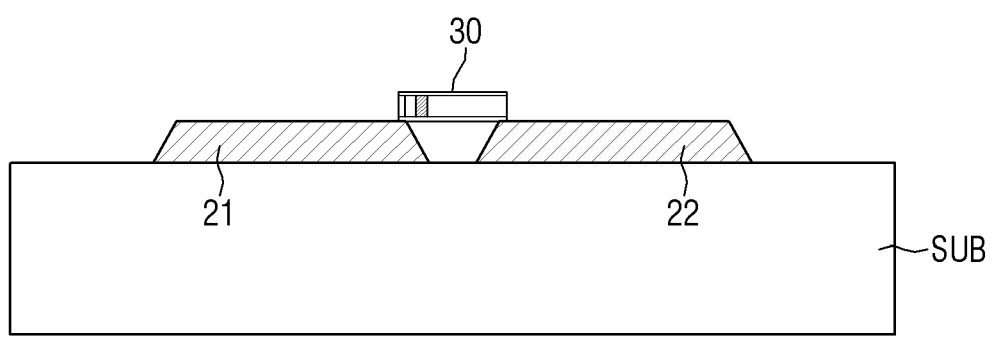

FIGS. 15 to 17 are cross-sectional views illustrating other active acts in a process of manufacturing a display device according to an embodiment.

First, referring to FIG. 15, when the light emitting element ink 1000 including the light emitting elements 30 is ejected on the target substrate SUB, an alignment signal AC is applied to the electrodes 21 and 22 to generate an electric field EL on the target substrate SUB. The light emitting elements 30 dispersed in the light emitting element solvent 100 may be subjected to a dielectrophoretic force by the electric field EL, and may be arranged on the electrodes 21 and 22 while alignment direction and position are changed.

When the electric field EL is generated on the target substrate SUB, the light emitting elements 30 may be subjected to a dielectrophoretic force. When the electric field EL generated on the target substrate SUB is generated in parallel (e.g., substantially in parallel) to the upper surface of the target substrate SUB, the extending direction of the light emitting element is aligned to be parallel (e.g., substantially parallel) to the target substrate SUB, so that the light emitting elements 30 may be arranged on the first electrode 21 and the second electrode 22. The light emitting elements 30 may move toward the electrodes 21 and 22 from the initially dispersed position by the dielectrophoretic force, respectively. Both ends of the light emitting element 30 may be on the first electrode 21 and the second electrode 22 while the position and alignment direction are changed by the electric field EL. The light emitting element 30 may include semiconductor layers doped with different conductivity types, and may have a dipole moment therein. When the light emitting element 30 having a dipole moment is placed on the electric field EL, the light emitting element 30 may be subjected to the dielectrophoretic force such that both ends thereof are on the electrodes 21 and 22, respectively.

The "alignment degree" of the light emitting elements 30 may refer to a deviation in the alignment direction and mounted position of the light emitting elements 30 aligned on the target substrate SUB. For example, when the deviation in the alignment direction and mounted position of the light emitting elements 30 is great, it may be understood that the alignment degree of the light emitting elements 30 is low, and when the deviation in the alignment direction and mounted position of the light emitting elements 30 is small, it may be understood that the alignment degree of the light emitting elements 30 is high or is improved.

However, during the process of manufacturing the display device 10, after the light emitting element 30 is between the electrodes 21 and 22, a process of removing the solvent 100 and the thickener 500 by applying heat or light to the light emitting element ink 1000 may be performed. The light emitting element ink 1000 ejected on the electrodes 21 and 22 may be in a state in which no shear stress is applied, and the light emitting element ink 1000 may have a high viscosity due to an intermolecular hydrogen bond of the thickener 500. Accordingly, the solvent 100 and the thickener 500 may not be removed easily, and may remain as foreign matter on the electrodes 21 and 22 and/or the light emitting elements 30. Further, as the light emitting element ink 1000 has a high viscosity, the intensity of the dielectrophoretic force acting on the light emitting elements 30 by the electric field formed on the electrodes 21 and 22 may not be sufficient or suitable. Moreover, high-temperature heat treatment may be required to remove the solvent 100 and the thickener 500 each having a large viscosity, and the initial alignment state of the light emitting elements 30 may be changed by an attraction force due to the flow of fluid or an attraction force between the thickener 500 and the light emitting elements 30 while removing the solvent 100 and the thickener 500.

In the method of manufacturing the display device 10 according to an embodiment, the solvent 100 and the thickener 500 may be completely removed through a heat treatment process under a low-pressure environment.

Referring to FIGS. 16 and 17, the process of removing the light emitting element solvent 100 and the thickener 500 may be performed in a chamber VCD capable of adjusting internal pressure. In the chamber VCD, the internal pressure in the device may be adjusted, and the target substrate SUB may be heated in a state in which the internal pressure is adjusted, so as to remove the light emitting element solvent 100 and the thickener 500'. In the state in which the light emitting elements 30 are on the electrodes 21 and 22 by the electric field EL, a shear stress is not applied to the thickener 500, and the thickener 500 may form an intermolecular hydrogen bond. When removing the light emitting element solvent 100 and the thickener 500 through heat treatment, energy for removing a hydrogen bond between molecules of the light emitting element solvent 100 and the thickener 500 may be further required in addition to energy for volatilizing their respective molecules. In this case, the heat treatment process should be performed at a temperature above the boiling point of each molecule, and the high-temperature heat treatment process may damage the circuit layers of the display device 10.

In the method of manufacturing the display device 10, the light emitting element solvent 100 and the thickener 500' may be heat treated under an environment of low-pressure to completely remove the light emitting element solvent 100 and the thickener 500' even at a temperature below the boiling point of the thickener 500'. According to an embodiment, the process of removing the light emitting element solvent 100 and the thickener 500' may be performed at a pressure in a range of 10-4 Torr to 1 Torr and a temperature in a range of 25° C. to 150° C. When the heat treatment process is performed within the above pressure range, the boiling point of the thickener 500' and the light emitting element solvent 100 may be lowered, and a hydrogen bond therebetween may be more easily removed. For example, when the thickener 500' is a compound including a triester group as in Chemical Formula 1, its boiling point may be 200° C. or higher and about 313° C. However, the thickener 500' and the light emitting element solvent 100 may be easily removed even at a temperature range of 150° C. or lower under a low-pressure environment as described above in the chamber VCD. The heat treatment process in the chamber VCD may be performed for 1 minute to 30 minutes. However, it is not limited thereto.

As the process of removing the light emitting element solvent 100 and the thickener 500' is performed by a heat treatment process under a low-pressure environment, the light emitting element solvent 100 and the thickener 500' that may remain as foreign matter in a subsequent process may be completely removed. Further, in the process of removing he light emitting element solvent 100 and the thickener 500', a change in the initial alignment state of the light emitting elements 30 due to an attraction force by fluid flow or an attraction force between the thickener 500 and the light emitting elements 30 may be prevented or reduced. For example, in the display device 10, the alignment degree of the light emitting elements 30 may be improved.

Subsequently, a plurality of insulating layers and a contact electrode 26 may be formed on the light emitting element 30 and the electrodes 21 and 22 to manufacture the display device 10. Through the above processes, the display device 10 including the light emitting elements 30 may be manufactured. The display device 10 may be manufactured using the light emitting element ink 1000 including the thickener 500. In the display device 10, a uniform number of light emitting elements 30 may be arranged for each unit area with high alignment degree, and product reliability may be improved.

In some embodiments, during the manufacturing process of the display device 10, a process of applying light may be further performed to further improve the alignment degree of the light emitting elements 30.

Figure 18:
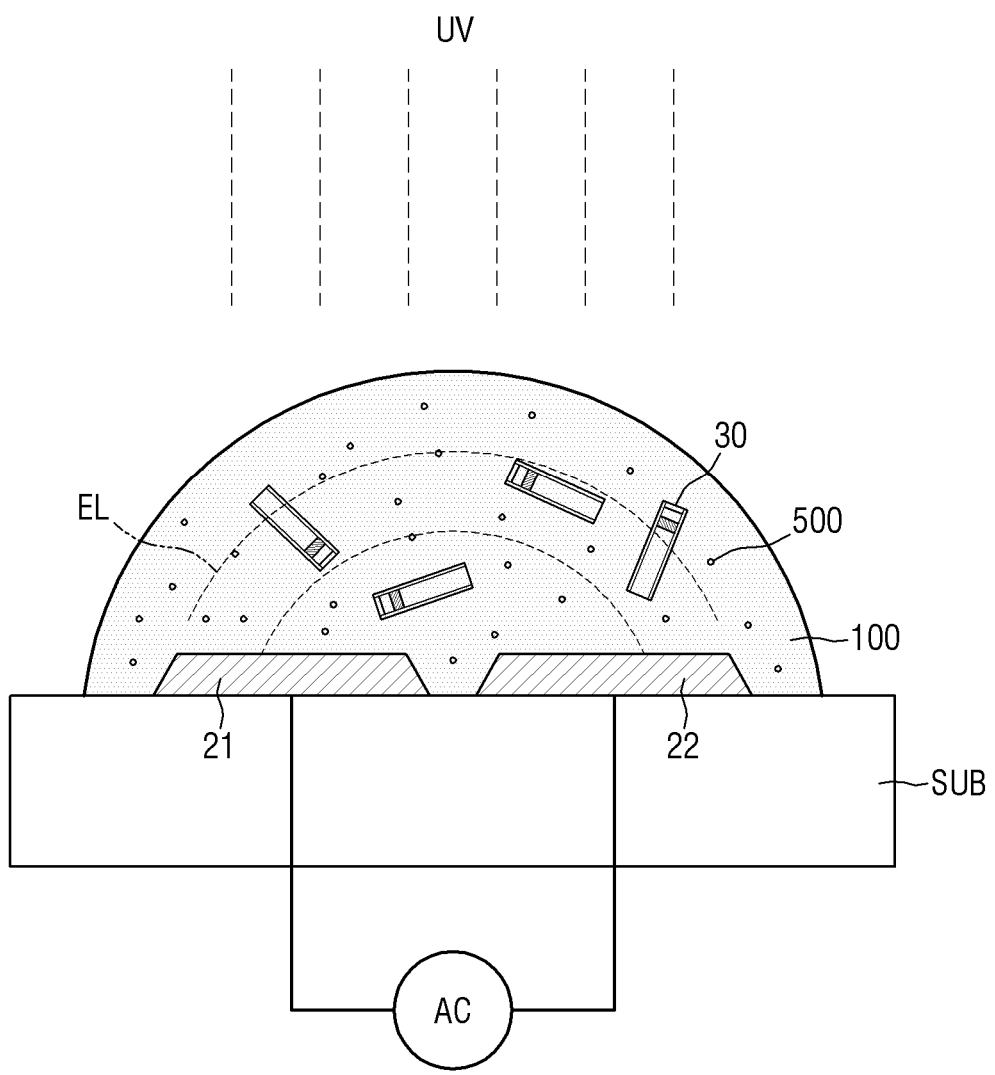
FIG. 18 is a cross-sectional view illustrating an active act in a process of manufacturing a display device according to another embodiment.

FIG. 18 is a cross-sectional view illustrating an active act in a process of manufacturing a display device according to another embodiment.

Referring to FIG. 18, in the process of manufacturing the display device 10, in the active act of forming an electric field EL on the electrodes 21 and 22, ultraviolet light UV may be applied to the light emitting elements 30 ejected on the target substrate SUB. The light emitting elements 30 may have a dipole moment, and when ultraviolet light UV is applied to the light emitting elements 30, the light emitting elements 30 may react with the ultraviolet light UV to have a larger dipole moment. The light emitting elements 30 having a large dipole moment may be aligned such that one ends thereof faces in a set or predetermined direction in response to the electric field EL formed on the electrodes 21 and 22. At the same time, at least one end of the light emitting elements 30 may be on the first electrode 21 or the second electrode 22. For example, each of the light emitting elements 30 may have a first end on the first electrode 21 and a second end on the second electrode 22.

In the active act of placing the light emitting elements 30 on the electrodes 21 and 22, when an electric field EL formed while applying ultraviolet light UV, the first ends of light emitting elements 30 may be aligned in a set or predetermined direction as the electrophoretic reactivity of the light emitting elements 30 increases. Accordingly, the light emitting elements 30 may be arranged on the electrodes 21 and 22 with high alignment degree, and product reliability of the display device 10 may be further improved.

The light emitting element ink according to an embodiment may include a volatile thickener to have a different viscosity in a printing state in a storage state. In the storage state of the light emitting element ink, the viscosity of a solution is high, so that precipitation of light emitting elements can be prevented or reduced. In the printing state of the light emitting element ink, the viscosity of the solution is low, so that a nozzle is not clogged, and thus, the ink can be easily discharged.

In the method of manufacturing a display device according to an embodiment, the display device is manufactured using the light emitting element ink, so that a printing process may be performed in a state in which light emitting elements are dispersed in the ink, a uniform number of light emitting elements for each unit area may be arranged with high alignment degree. Further, through heat treatment under a low-pressure environment, a light emitting element solvent and a thickener remaining as foreign mater in a subsequent process may be completely removed. Therefore, a display device having improved product reliability can be manufactured.

In concluding the detailed description, those skilled in the art will appreciate that many variations and modifications can be made to the disclosed embodiments without substantially departing from the principles of the present disclosure. Therefore, the disclosed embodiments of the disclosure are used in a generic and descriptive sense only and not for purposes of limitation.

What is claimed is:

1. A light emitting element ink, comprising:

a light emitting element solvent;

a light emitting element dispersed in the light emitting element solvent, each light emitting element comprising a plurality of semiconductor layers and an insulating film surrounding outer surfaces of the semiconductor layers;

a thickener dispersed in the light emitting element solvent, wherein a compound of the thickener comprises a functional group capable of forming a hydrogen bond together with a compound of the light emitting element solvent or another compound of the thickener, and the compound of the thickeners represented by Chemical Formula 1 below:

Chemical Formula 1

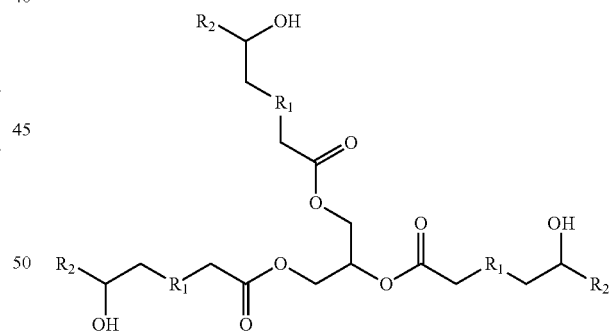

wherein, in Chemical Formula 1, each $R_1$ is independently a substituted or unsubstituted alkyl group having 6 to 8 carbon atoms, an alkene group, an alkenyl group, or an alkynyl group, and each $R_2$ is independently an alkyl group having 3 to 8 carbon atoms.

2. The light emitting element ink of claim 1, wherein the compound of the thickener is represented by any one selected from Chemical Formulas 2 to 6:

Chemical Formula 2
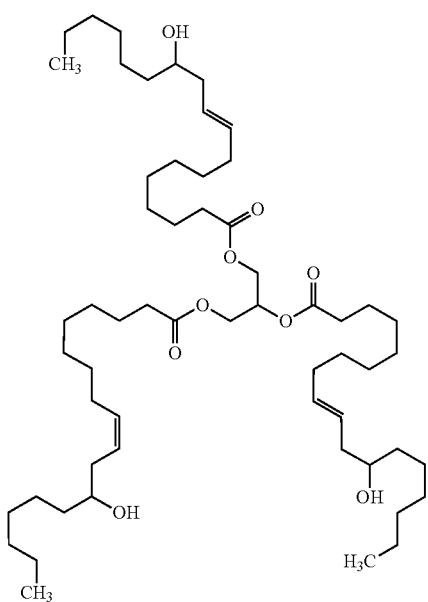
Chemical Formula 4
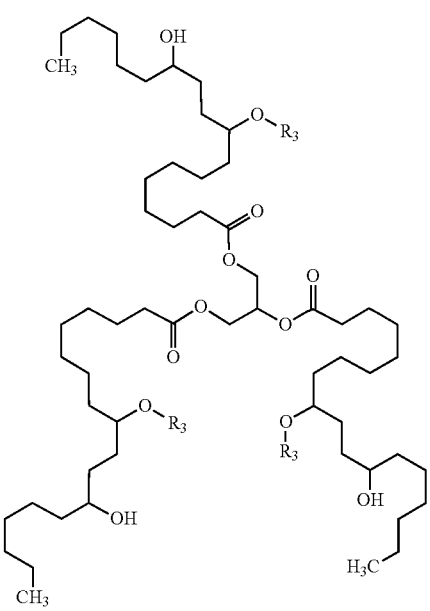
Chemical Formula 3
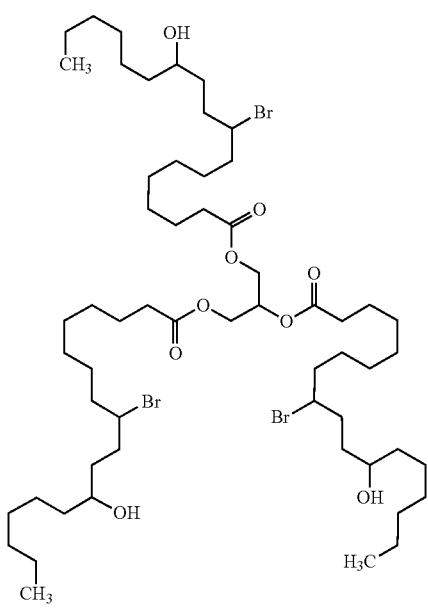
Chemical Formula 5
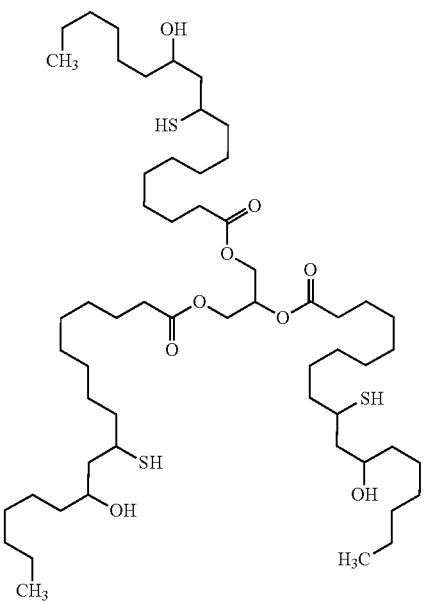

-continued

Chemical Formula 6

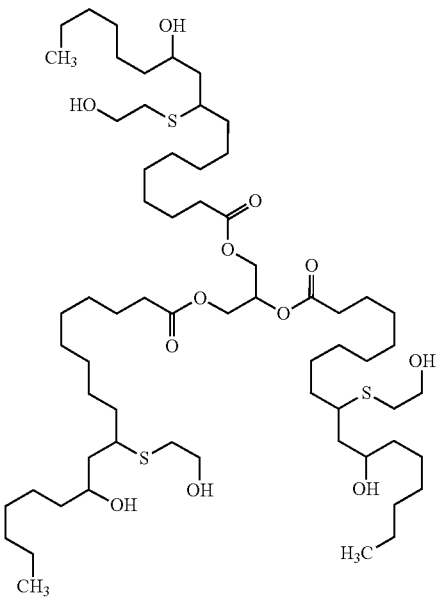

wherein, in Chemical Formula 4, $R_3$ is *—$(CH_2CH_2O)xCH_3$, x is an integer of 7 to 112, and —* is a bond to an oxygen atom (O)).

3. The light emitting element ink of claim 2,
wherein, in a state in which a shear stress is not applied to the light emitting element ink, the compound of the thickener forms an intermolecular hydrogen bond together with the compound of the light emitting element solvent and the other compound of the thickener to form a network structure.

4. The light emitting element ink of claim 3,
wherein the light emitting element ink has a viscosity in a range of from 30 cP to 300 cP, measured at 25° C. in a state in which the shear stress is not applied to the light emitting element ink.

5. The light emitting element ink of claim 2,
wherein, in a state in which a shear stress is applied to the light emitting element ink, the compound of the thickener does not form an intermolecular hydrogen bond together with the compound of the light emitting element solvent or the other compound of the thickener, and the light emitting element ink has a viscosity in a range of from 5 cP to 15 cP, measured at 25° C.

6. The light emitting element ink of claim 2,
wherein the light emitting element is included in the light emitting element ink in an amount of 0.01 to 1 part by weight with respect to 100 parts by weight of the light emitting element ink, and
the thickener is included in the light emitting element ink in an amount of 100 to 500 parts by weight with respect to 100 parts by weight of the light emitting element.

7. The light emitting element ink of claim 6, further comprising:
a dispersant dispersed in the light emitting element solvent,
wherein the dispersant is included in the light emitting element ink in an amount of 10 to 50 parts by weight with respect to 100 parts by weight of the light emitting element.

8. The light emitting element ink of claim 1,
wherein the semiconductor layers of the light emitting element comprises a first semiconductor layer, a second semiconductor layer, and a light emitting layer between the first semiconductor layer and the second semiconductor layer, and
the insulating film of the light emitting element surrounds at least an outer surface of the light emitting layer.

* * * * *